(12) United States Patent
Wu

(10) Patent No.: US 9,692,992 B2
(45) Date of Patent: Jun. 27, 2017

(54) COLOR AND INFRARED FILTER ARRAY PATTERNS TO REDUCE COLOR ALIASING

(71) Applicant: OMNIVISION TECHNOLOGIES, INC., Santa Clara, CA (US)

(72) Inventor: Donghui Wu, Sunnyvale, CA (US)

(73) Assignee: OmniVision Technologies, Inc., Santa Clara, CA (US)

(*) Notice: Subject to any disclaimer, the term of this patent is extended or adjusted under 35 U.S.C. 154(b) by 188 days.

(21) Appl. No.: 14/249,006

(22) Filed: Apr. 9, 2014

(65) Prior Publication Data

US 2015/0002707 A1 Jan. 1, 2015

Related U.S. Application Data

(60) Provisional application No. 61/856,558, filed on Jul. 19, 2013, provisional application No. 61/841,818, filed on Jul. 1, 2013.

(51) Int. Cl.
*H04N 3/14* (2006.01)
*H04N 5/335* (2011.01)
(Continued)

(52) U.S. Cl.
CPC ....... *H04N 5/332* (2013.01); *H01L 27/14621* (2013.01); *H04N 9/045* (2013.01); *H04N 2209/045* (2013.01)

(58) Field of Classification Search
CPC ........ H01L 27/14621; H01L 27/14607; H04N 9/045; H04N 9/07; H04N 3/14; H04N 5/335; H04N 9/04
(Continued)

(56) References Cited

U.S. PATENT DOCUMENTS

| 4,437,112 A * | 3/1984 | Tanaka | H04N 9/045 348/279 |
| 6,252,218 B1 * | 6/2001 | Chou | H01L 27/14603 250/208.1 |

(Continued)

FOREIGN PATENT DOCUMENTS

| EP | 2 194 721 A2 | 6/2010 |
| WO | WO 2007/015765 A | 2/2007 |

(Continued)

OTHER PUBLICATIONS

JP 2014-135239—First Japanese Office Action with English translation, mailed Oct. 26, 2015, 12 pages.
(Continued)

*Primary Examiner* — Chia-Wei A Chen
(74) *Attorney, Agent, or Firm* — Blakely Sokoloff Taylor & Zafman LLP

(57) ABSTRACT

Embodiments of a color filter array include a plurality of tiled minimal repeating units, each minimal repeating unit comprising an M×N set of individual filters, and each individual filter in the set having a photoresponse selected from among four different photoresponses. Each minimal repeating unit includes a checkerboard pattern of filters of the first photoresponse, and filters of the second, third, and fourth photoresponses distributed among the checkerboard pattern such that the filters of the second, third, and fourth photoresponses are sequentially symmetric about one or both of a pair of orthogonal axes of the minimal repeating unit.

19 Claims, 18 Drawing Sheets

(51) Int. Cl.
*H04N 9/04* (2006.01)
*H04N 9/07* (2006.01)
*H04N 5/33* (2006.01)
*H01L 27/146* (2006.01)

(58) Field of Classification Search
USPC ............................... 348/272–284; 250/208.1
See application file for complete search history.

(56) References Cited

U.S. PATENT DOCUMENTS

| | | | |
|---|---|---|---|
| 6,759,646 B1 | 7/2004 | Acharya et al. | |
| 6,847,397 B1* | 1/2005 | Osada | H04N 9/045 |
| | | | 348/273 |
| 7,274,393 B2 | 9/2007 | Acharya | |
| 7,460,160 B2 | 12/2008 | Hershey et al. | |
| 7,560,679 B1 | 7/2009 | Gutierrez | |
| 7,633,538 B2 | 12/2009 | Beck et al. | |
| 7,746,396 B2* | 6/2010 | Mikkonen | H04N 5/2254 |
| | | | 348/164 |
| 7,839,437 B2* | 11/2010 | Kasai | H04N 5/23232 |
| | | | 348/224.1 |
| 7,893,976 B2 | 2/2011 | Compton et al. | |
| 7,956,325 B2 | 6/2011 | Tanimoto | |
| 8,045,024 B2* | 10/2011 | Kumar | G06T 3/4015 |
| | | | 348/222.1 |
| 8,068,153 B2* | 11/2011 | Kumar | G06T 3/4015 |
| | | | 348/242 |
| 8,138,466 B2* | 3/2012 | Hosaka | H04N 5/332 |
| | | | 250/208.1 |
| 8,227,883 B2 | 7/2012 | Kasano et al. | |
| 8,508,633 B2 | 8/2013 | Hirose | |
| 8,779,425 B2 | 7/2014 | Moon et al. | |
| 9,392,238 B2* | 7/2016 | Hirota | H04N 9/045 |
| 2003/0112353 A1 | 6/2003 | Morris | |
| 2004/0169748 A1 | 9/2004 | Acharya et al. | |
| 2005/0136766 A1 | 6/2005 | Tanner et al. | |
| 2005/0174617 A1 | 8/2005 | Hosier et al. | |
| 2006/0186322 A1 | 8/2006 | Matsuyama | |
| 2006/0250509 A1* | 11/2006 | Koshiba | H04N 9/045 |
| | | | 348/272 |
| 2007/0024931 A1* | 2/2007 | Compton | H04N 9/045 |
| | | | 358/512 |
| 2007/0153104 A1* | 7/2007 | Ellis-Monaghan | H04N 9/045 |
| | | | 348/272 |
| 2007/0201738 A1 | 8/2007 | Toda et al. | |
| 2007/0206104 A1 | 9/2007 | Wada | |
| 2007/0251393 A1 | 11/2007 | Pope et al. | |
| 2008/0074518 A1* | 3/2008 | Beck | H04N 9/045 |
| | | | 348/272 |
| 2008/0079828 A1 | 4/2008 | Izawa | |
| 2008/0087800 A1 | 4/2008 | Toda | |
| 2008/0131028 A1 | 6/2008 | Pillman et al. | |
| 2008/0218597 A1* | 9/2008 | Cho | H04N 5/2351 |
| | | | 348/222.1 |
| 2008/0298708 A1* | 12/2008 | Ovsiannikov | H04N 9/045 |
| | | | 382/261 |
| 2009/0009621 A1 | 1/2009 | Yamaguchi et al. | |
| 2009/0021629 A1* | 1/2009 | Yamada | H01L 27/14627 |
| | | | 348/311 |
| 2009/0051984 A1 | 2/2009 | O'Brien et al. | |
| 2009/0159799 A1 | 6/2009 | Copeland et al. | |
| 2009/0190074 A1 | 7/2009 | Woo et al. | |
| 2010/0019129 A1 | 1/2010 | Ishigaki et al. | |
| 2010/0108866 A1* | 5/2010 | Tseng | H01L 27/14621 |
| | | | 250/226 |
| 2010/0136225 A1 | 6/2010 | Lal et al. | |
| 2010/0141812 A1* | 6/2010 | Hirota | H04N 9/045 |
| | | | 348/279 |
| 2010/0220228 A1 | 9/2010 | Otake et al. | |
| 2010/0238330 A1* | 9/2010 | Hirota | H01L 27/14621 |
| | | | 348/273 |
| 2010/0289885 A1 | 11/2010 | Lu et al. | |
| 2010/0302418 A1* | 12/2010 | Adams, Jr. | H04N 9/045 |
| | | | 348/281 |
| 2010/0309350 A1 | 12/2010 | Adams, Jr. et al. | |
| 2011/0134293 A1 | 6/2011 | Tanaka | |
| 2012/0075509 A1* | 3/2012 | Ito | H01L 27/14621 |
| | | | 348/265 |
| 2012/0200734 A1 | 8/2012 | Tang | |
| 2012/0236190 A1 | 9/2012 | Ogasahara et al. | |
| 2012/0293695 A1 | 11/2012 | Tanaka | |
| 2013/0075588 A1* | 3/2013 | Kawaguchi | H04N 5/374 |
| | | | 250/208.1 |
| 2013/0083214 A1 | 4/2013 | Nakata | |
| 2013/0216130 A1* | 8/2013 | Saito | H04N 9/045 |
| | | | 382/165 |
| 2013/0242199 A1* | 9/2013 | Hatano | H04N 9/045 |
| | | | 348/659 |
| 2013/0286263 A1 | 10/2013 | Hayashi et al. | |
| 2014/0062882 A1 | 3/2014 | Ozawa et al. | |
| 2014/0125810 A1 | 5/2014 | D'Amico et al. | |
| 2014/0132775 A1 | 5/2014 | Fischer et al. | |
| 2014/0184808 A1 | 7/2014 | Ryoki et al. | |
| 2014/0240492 A1 | 8/2014 | Lee | |
| 2014/0294294 A1* | 10/2014 | Tsuchiya | G06T 5/003 |
| | | | 382/159 |
| 2014/0307132 A1* | 10/2014 | Kawai | H04N 9/07 |
| | | | 348/273 |
| 2014/0333814 A1 | 11/2014 | Tashiro | |
| 2015/0156405 A1* | 6/2015 | Izawa | G02B 7/34 |
| | | | 348/246 |
| 2015/0356710 A1* | 12/2015 | Kunze | G06T 3/4015 |
| | | | 348/91 |
| 2016/0080706 A1 | 3/2016 | Kaiser et al. | |
| 2016/0150165 A1 | 5/2016 | Grauer et al. | |

FOREIGN PATENT DOCUMENTS

| | | |
|---|---|---|
| WO | WO 2008/066698 A2 | 6/2008 |
| WO | WO 2010/141055 A2 | 12/2010 |
| WO | WO 2014/063701 A1 | 5/2014 |

OTHER PUBLICATIONS

KR 2014-0082097—Second Korean Office Action with English translation, mailed Nov. 19, 2015, 5 pages.
KR 2014-0082097—Korean Notice of Allowance with English translation, mailed Jan. 18, 2016, 3 pages.
TW 103122398—First Taiwanese Office Action and Search Report with English Translation, mailed on Dec. 24, 2015, 12 pages.
TW 103122398—Second Office Action with translation, mailed Apr. 20, 2016, 12 pages.
JP 2014-135239—Second Office Action with translation, mailed May 11, 2016, 26 pages.
KR 2014-0082097—First Korean Office Action with English translation, mailed May 4, 2015, 11 pages.
EP 14175090.1—European Search Report and Search Opinion, issued Mar. 31, 2015, 12 pages.
CN 201410302864.9—First Chinese Office Action with translation, mailed on Mar. 2, 2016, 16 pages.
TW 103122398—Fourth Office Action with translation, mailed Nov. 22, 2016, 9 pages.
TW 105123090—First Office Action with translation, mailed Nov. 22, 2016, 12 pages.
EP 14175090.1—European Office Action, issued Dec. 3, 2014, 2 pages.
U.S. Appl. No. 14/642,220—Restriction Requirement mailed Mar. 18, 2016, 7 pages.
U.S. Appl. No. 14/642,220—Non Final Office Action mailed Aug. 24, 2016, 15 pages.
TW 103122398—Third Office Action with translation, mailed Aug. 2, 2016, 9 pages.

* cited by examiner

EMB 1.

|   |   |   |   |   |   |   |   |
|---|---|---|---|---|---|---|---|
| B | W | G | W | G | W | B | W |
| W | B | W | G | W | G | W | B |
| G | W | R | W | R | W | G | W |
| W | G | W | R | W | R | W | G |
| G | W | B | W | B | W | G | W |
| W | G | W | B | W | B | W | G |
| R | W | G | W | G | W | R | W |
| W | R | W | G | W | G | W | R |

EMB 2

|   |   |   |   |   |   |   |   |
|---|---|---|---|---|---|---|---|
| B | W | G | W | G | W | B | W |
| W | R | W | G | W | G | W | R |
| G | W | B | W | B | W | G | W |
| W | G | W | R | W | R | W | G |
| G | W | B | W | B | W | G | W |
| W | G | W | R | W | R | W | G |
| B | W | G | W | G | W | B | W |
| W | R | W | G | W | G | W | R |

| B | G | IR | G |
|---|---|---|---|
| G | B | G | IR |
| IR | G | R | G |
| G | IR | G | R |

| R | G | IR | G |
|---|---|---|---|
| G | R | G | IR |
| IR | G | B | G |
| G | IR | G | B |

| IR | G | R | G |
|---|---|---|---|
| G | IR | G | R |
| B | G | IR | G |
| G | B | G | IR |

| IR | G | B | G |
|---|---|---|---|
| G | IR | G | B |
| R | G | IR | G |
| G | R | G | IR |

| B | G | IR | G |
|---|---|---|---|
| G | R | G | IR |
| IR | G | B | G |
| G | IR | G | R |

| IR | G | B | G |
|---|---|---|---|
| G | IR | G | R |
| B | G | IR | G |
| G | R | G | IR |

*Fig. 9F*

EMB 7

| B | G | IR | G | IR | G | R | G |
| G | B | G | IR | G | IR | G | R |
| IR | G | R | G | B | G | IR | G |
| G | IR | G | R | G | B | G | IR |
| IR | G | B | G | R | G | IR | G |
| G | IR | G | B | G | R | G | IR |
| R | G | IR | G | IR | G | B | G |
| G | R | G | IR | G | IR | G | B |

*Fig. 10A*

EMB 9

| B | G | IR | G | IR | G | B | G |
| G | B | G | IR | G | IR | G | R |
| IR | G | R | G | R | G | IR | G |
| G | IR | G | B | G | R | G | IR |
| IR | G | R | G | B | G | IR | G |
| G | IR | G | R | G | R | G | IR |
| R | G | IR | G | IR | G | B | G |
| G | B | G | IR | G | IR | G | B |

*Fig. 10B*

EMB 2

| B | G | IR | G | IR | G | B | G |
| G | R | G | IR | G | IR | G | R |
| IR | G | B | G | B | G | IR | G |
| G | IR | G | R | G | R | G | IR |
| IR | G | B | G | B | G | IR | G |
| G | IR | G | R | G | R | G | IR |
| B | G | IR | G | IR | G | B | G |
| G | R | G | IR | G | IR | G | R |

*Fig. 10C*

LOW-DENSITY IR 1

| B | G | IR | G |
|---|---|----|---|
| G | R | G  | B |
| R | G | B  | G |
| G | IR| G  | R |

*Fig. 11A*

EMB 10

| B | G | IR | G | B | G | IR | G |
|---|---|----|---|---|---|----|---|
| G | R | G  | B | G | R | G  | B |
| R | G | B  | G | R | G | B  | G |
| G | IR| G  | R | G | IR| G  | R |
| B | G | IR | G | B | G | IR | G |
| G | R | G  | B | G | R | G  | B |
| R | G | B  | G | R | G | B  | G |
| G | IR| G  | R | G | IR| G  | R |

COLOR AND INFRARED FILTER ARRAY PATTERNS TO REDUCE COLOR ALIASING

CROSS-REFERENCE TO RELATED APPLICATIONS

This application claims priority under 35 U.S.C. §119(e) to U.S. Provisional Application No. 61/841,818, filed 1 Jul. 2013, and U.S. Provisional Application No. 61/856,558, filed 19 Jul. 2013. Both provisional applications are currently pending and are incorporated herein by reference in their entirety.

TECHNICAL FIELD

The disclosed embodiments relate generally to image sensors and in particular, but not exclusively, to color and infrared filter array patterns to reduce color aliasing in image sensors, including image sensors having a global shutter.

BACKGROUND

Color aliasing is a generally undesirable effect caused by certain color filter array (CFA) patterns of charge-coupled device (CCD) or complementary metal oxide semiconductor (CMOS) image sensors. As a typical example of color aliasing, a small white line on a black or otherwise dark background that registers on individual pixels will be interpreted as a line containing single pixels of each of the primary colors registered. It is therefore desirable to design CFA patterns that minimize color aliasing.

BRIEF DESCRIPTION OF THE DRAWINGS

Non-limiting and non-exhaustive embodiments of the present invention are described with reference to the following figures, wherein like reference numerals refer to like parts throughout the various views unless otherwise specified.

FIGS. 7A-7K are diagrams of embodiments of constituent filter patterns that can be used to form minimal repeating units.

FIGS. 8A-8F are diagrams of embodiments of minimal repeating units that can be formed using one or more of the embodiments of constituent filter patterns shown in FIGS. 7A-7K.

FIGS. 9A-9F are diagrams of other embodiments of constituent filter patterns that include infrared filters and can be used to form minimal repeating units.

FIGS. 10A-10C are diagrams of embodiments of minimal repeating units that can be formed using one or more of the embodiments of constituent filter patterns shown in FIGS. 9A-9F.

FIGS. 11A-11B are diagrams of embodiments of a low-density infrared constituent filter pattern and a minimal repeating unit that can be formed using the low-density infrared constituent filter pattern.

DETAILED DESCRIPTION OF ILLUSTRATED EMBODIMENTS

Embodiments are described of an apparatus, system and method for color and infrared color filter array patterns to reduce color aliasing. Specific details are described to provide a thorough understanding of the embodiments, but one skilled in the relevant art will recognize that the invention can be practiced without one or more of the described details, or with other methods, components, materials, etc. In some instances, well-known structures, materials, or operations are not shown or described in detail but are nonetheless encompassed within the scope of the invention.

Reference throughout this specification to "one embodiment" or "an embodiment" means that a particular feature, structure, or characteristic described in connection with the embodiment is included in at least one described embodiment. Thus, appearances of the phrases "in one embodiment" or "in an embodiment" do not necessarily all refer to the same embodiment. Furthermore, the described features, structures, or characteristics can be combined in any suitable manner in one or more embodiments.

Figure 1:
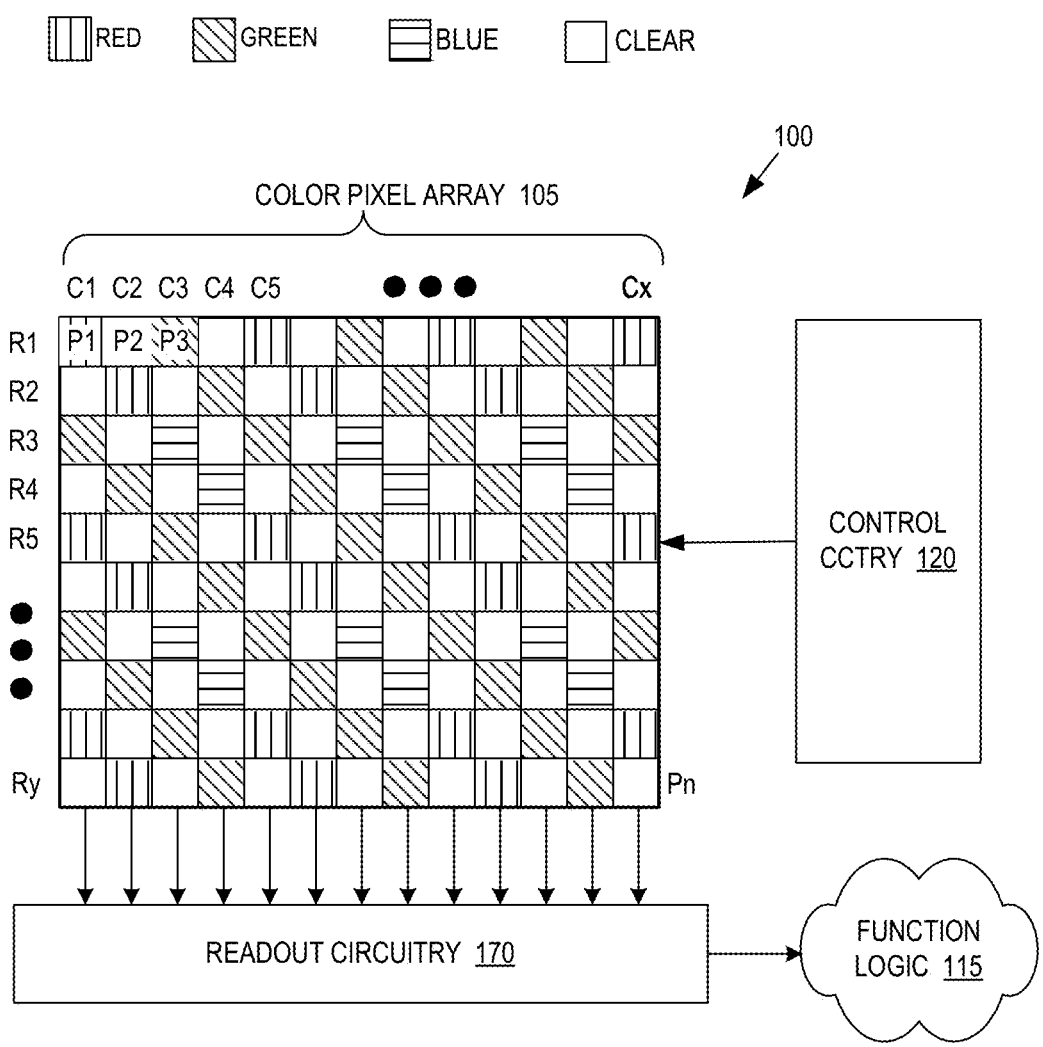
FIG. 1 is a schematic of an embodiment of an image sensor including a color filter array.
Figure 5A:
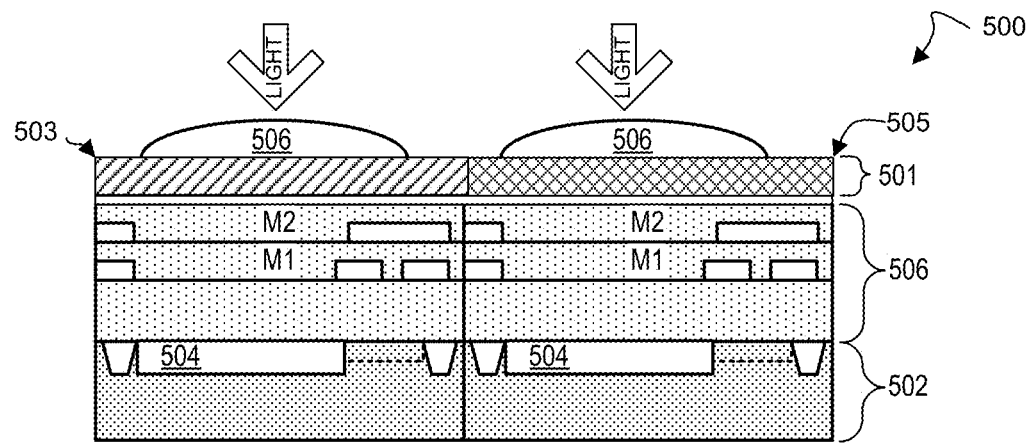
FIGS. 5A-5B are cross-sections of a pair of frontside illuminated pixels and a pair of backside-illuminated pixels.
Figure 5B:
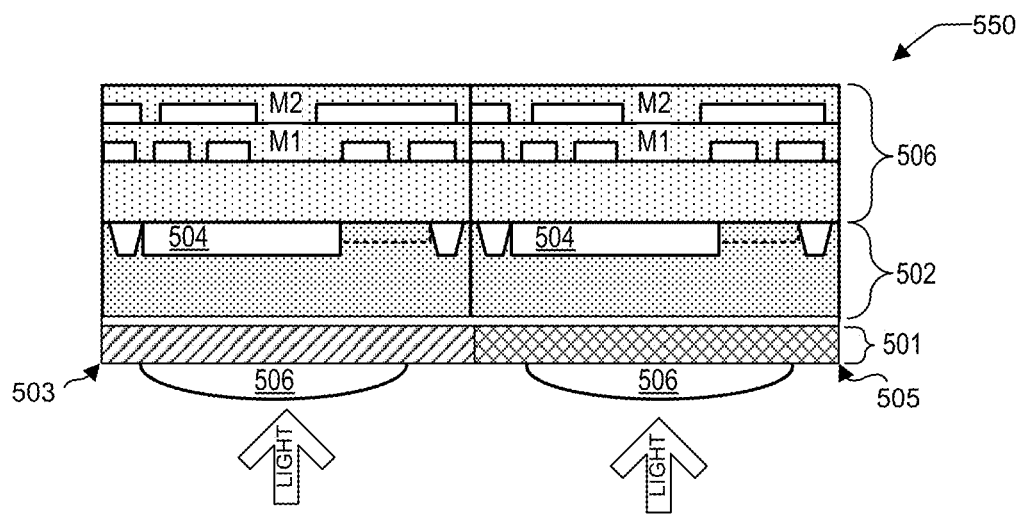

FIG. 1 illustrates an embodiment of a complementary metal oxide semiconductor (CMOS) image sensor 100 including a color pixel array 105, readout circuitry 170 coupled to the pixel array, function logic 115 coupled to the readout circuitry, and control circuitry 120 coupled to the pixel array. Color pixel array 105 is a two-dimensional ("2D") array of individual imaging sensors or pixels (e.g., pixels P1, P2 . . . , Pn) having X pixel columns and Y pixel rows. Color pixel array 105 can be implemented in a frontside-illuminated image sensor, as shown in FIG. 5A, or as a backside-illuminated image sensor, as shown in FIG. 5B. As illustrated, each pixel in the array is arranged into a row (e.g., rows R1 to Ry) and a column (e.g., column C1 to Cx) to acquire image data of a person, place, or object, which can then be used to render a 2D image of the person, place, or object. Color pixel array 105 assigns color to each pixel using a color filter array ("CFA") coupled to the pixel array, as further discussed below in connection with the disclosed embodiments of color filter arrays.

After each pixel in pixel array 105 has acquired its image data or image charge, the image data is read out by readout circuitry 170 and transferred to function logic 115 for storage, additional processing, etc. Readout circuitry 170 can include amplification circuitry, analog-to-digital ("ADC") conversion circuitry, or other circuits. Function logic 115 can store the image data and/or manipulate the image data by applying post-image effects (e.g., crop, rotate, remove red eye, adjust brightness, adjust contrast, or otherwise). Function logic 115 can also be used in one embodiment to process the image data to correct (i.e., reduce or remove) fixed pattern noise. Control circuitry 120 is coupled to pixel array 105 to control operational characteristic of color pixel array 105. For example, control circuitry 120 can generate a shutter signal for controlling image acquisition.

Figure 2:
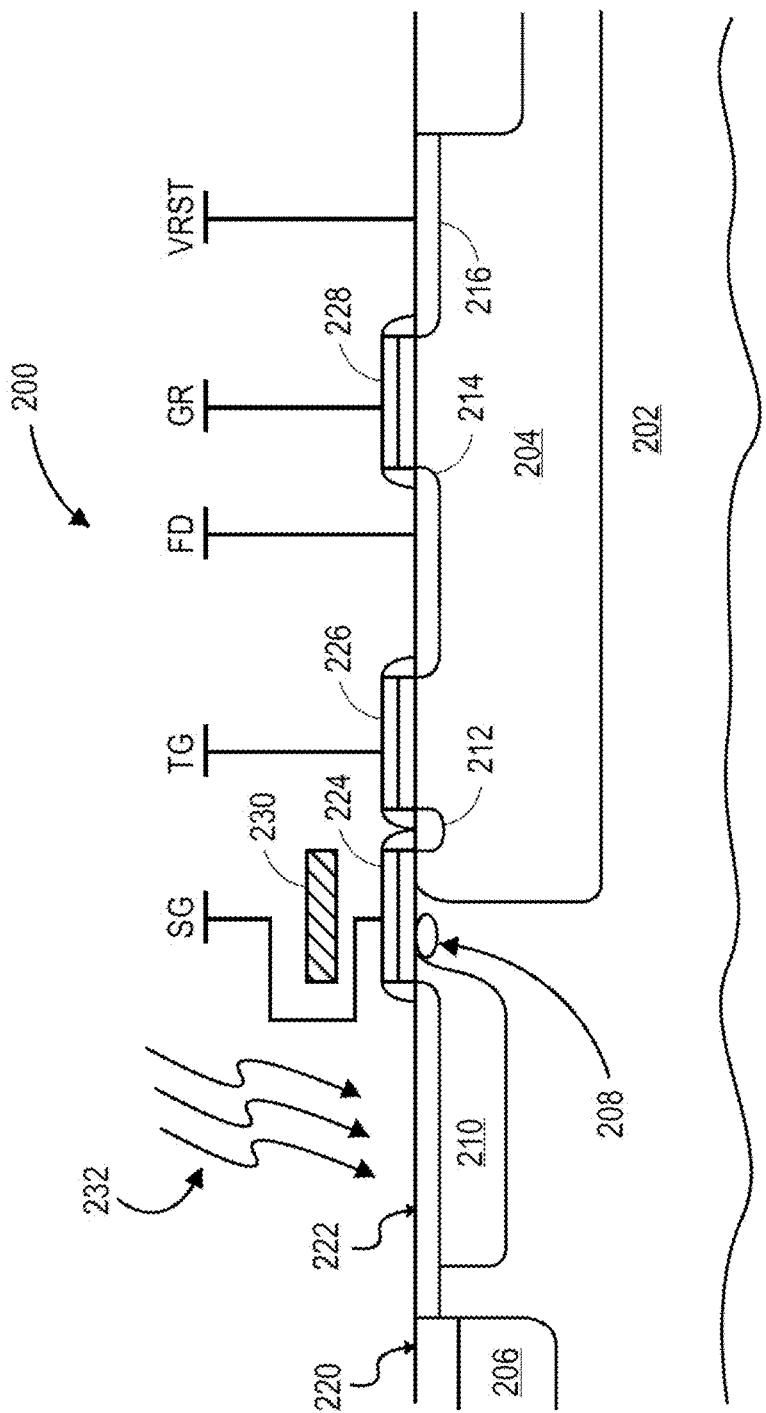
FIG. 2 is a cross-sectional view of an embodiment of an image sensor pixel including provisions for a global shutter.
Figure 3:
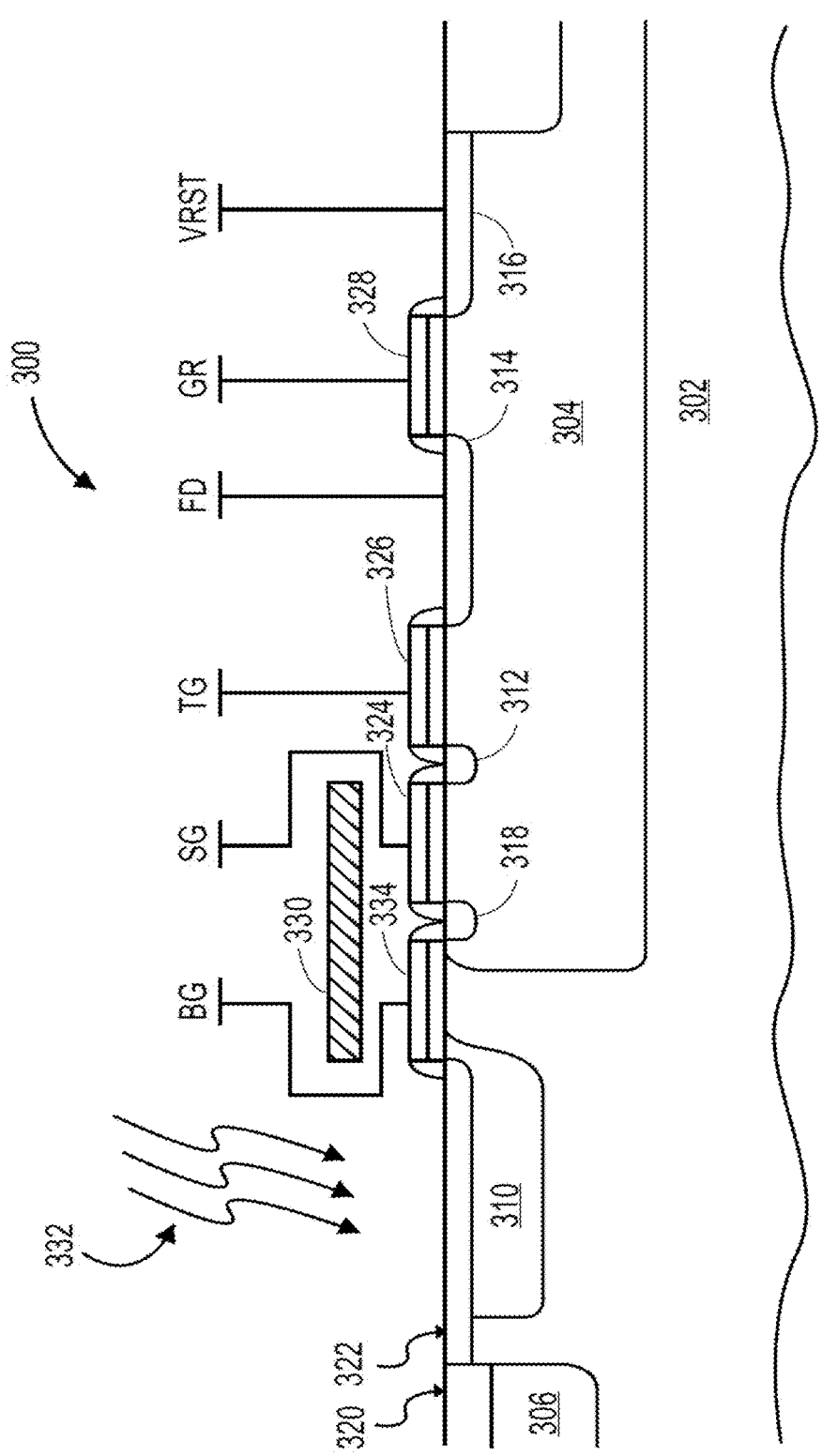
FIG. 3 is a cross-sectional view of another embodiment of an image sensor pixel including provisions for a global shutter.
Figure 4:
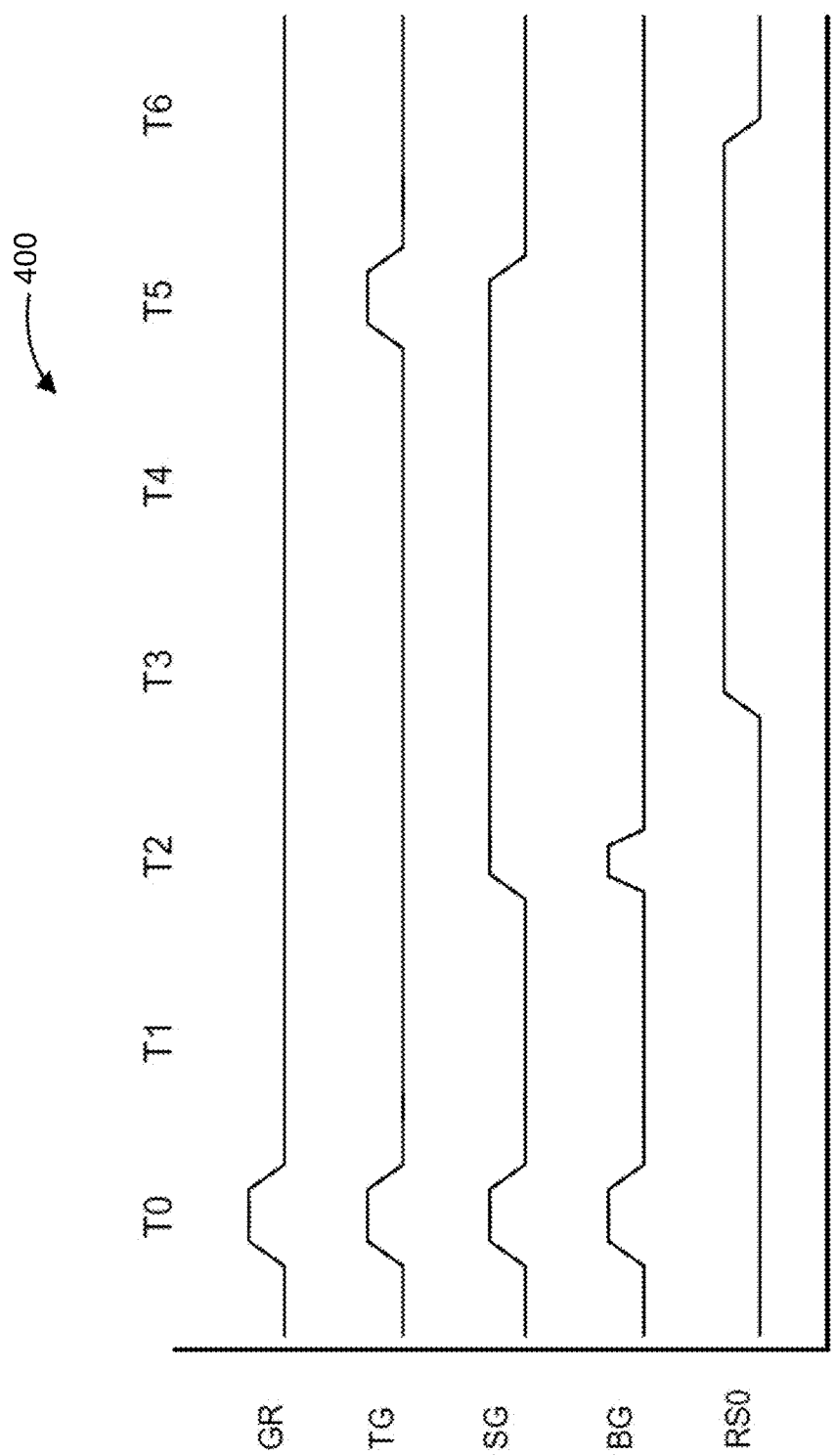
FIG. 4 is a timing diagram illustrating an embodiment of operation of the image sensor pixels of FIGS. 2-3.

FIGS. 2-4 illustrate embodiments of pixels including a global reset or global shutter. These embodiments are further described in U.S. Pat. No. 7,781,718, which is hereby incorporated by reference in its entirety. The illustrated global-shutter pixels can be used in a pixel array coupled to any of the color filter arrays described herein.

FIG. 2 illustrates of a cross-section of a sample "one-shared" pixel structure having a barrier implant that is implemented in a pixel array. Pixel structure 200 includes a substrate 202 in which P-well structures 204 and 206 are formed. Photodiode region 210 is implanted and/or diffused in substrate 202. Photodiode region 210 can be hydrogenated amorphous silicon formed on the substrate 202. N-type regions 212, 214, and 216 are formed in P-well 204. A pinning layer 222 can be formed above region 210 which helps to confine photoelectrons to the region 210 until readout time. Region 212 can be a doped P-type or a lightly doped N-type.

Insulating structure 220 is formed above P-well structure 206. Insulating structures 220 can be formed using processes such as shallow trench isolation (STI) or local oxidation of silicon (LOCOS). An insulating structure 220 using an STI process can be formed by etching a void within P-well structure 206 and depositing a dielectric material (such as silicon dioxide) within the void. The deposited dielectric material can be planarized using CMP.

A storage gate transistor has a gate 224 in an area that is above and between regions 210 and 212. The storage gate (SG) transistor is controlled by signal SG (as discussed more fully with respect to FIG. 6). The storage gate transistor controls flow of electrons from the photodiode region 210 to the storage gate 224 when the captured charge is transferred to the storage gate. The storage gate transistor also controls flow of electrons from the storage gate 224 to the floating diffusion 214 when the transfer gate is turned on. The primary charge storage region is the storage gate 224.

A barrier implant 208 is formed in a region beneath storage gate 224 in substrate 202. The barrier implant can be formed using a P-type implant. Barrier implant 208 helps reduce image lag by helping to prevent charge that flows through the channel formed beneath the storage gate 224 (when gate 224 is activated) from flowing backwards into region 210.

A photoshield 230 is provided, for example, above storage gate 224 to help define an edge of an aperture through which photons 232 can be captured. Photoshield 230 also helps to prevent photons 232 from adversely affecting the stored electrical charge of the pixel after integration (the operation of the pixel is discussed more fully below with reference to FIG. 6). The photoshield 230 structure can be formed by depositing a metal layer or silicides over the storage gate 224.

A transfer gate transistor is formed using regions 212 and region 214 by forming the gate 226 in a region that is above and between regions 212 and 214. The transfer gate (TG) transistor is controlled by signal TG, as discussed more fully with respect to FIG. 4. The transfer gate transistor controls flow of electrons from the storage gate 224 to the floating diffusion region 214 when the captured charge is being transferred for readout. The transfer gate transistor also controls flow of electrons from the floating diffusion region 214 to the photodiode region 210 when both the storage gate and the transfer gate are turned on.

A global reset transistor is formed using region 216 and region 214 by forming the global reset gate 228 in a region that is above and between regions 216 and 214. The global reset (GR) transistor is controlled by signal GR, as discussed more fully with respect to FIG. 4. The global reset transistor controls flow of electrons from the reset voltage (VRST) region 216 to floating diffusion (FD) region 214 when the pixel is being (globally) reset. If the storage gate 224 and the transfer gate are also turned on, the global reset transistor will reset the photodiode region 210. The global reset transistor also can be used to implement a row reset of the FD as part of the readout of pixels within rows.

FIG. 3 illustrates of a cross-section of a sample "one-shared" pixel structure 300 having a barrier gate transistor that is implemented in a pixel array. Structure 300 includes a substrate 302 in which P-well structures 304 and 306 are formed. Photodiode region 310 is implanted and/or diffused in substrate 302. N-type regions 312, 314, and 316 are formed in P-well 304. A pinning layer 322 can be formed above region 310 which helps to confine photoelectrons to the region 310 until readout time.

Insulating structure 320 is formed above P-well structure 306. Insulating structure 320 can be formed using processes such as shallow trench isolation (STI) or local oxidation of silicon (LOCOS). An insulating structure 320 using an STI process can be formed by etching a trench within P-well structure 306 and depositing a dielectric material (such as silicon dioxide) within the trench. The deposited dielectric material can be planarized using CMP.

A barrier gate transistor is formed using regions 310 and region 318 by forming the transistor gate 334 in an area that is above and between regions 310 and 318. The barrier gate (BG) transistor is controlled by signal BG, as discussed more fully with respect to FIG. 4. The barrier gate transistor controls flow of electrons from the photodiode region 310 to region 318. The barrier transistor helps reduce image lag by operating in conjunction with the storage gate transistor (discussed below) helping to prevent charge that flows through the channel formed beneath the storage gate 324 (when gate 324 is activated) from flowing backwards into region 310.

A storage gate transistor is formed using regions 318 and region 312 by forming the transistor gate 324 in an area that is above and between regions 318 and 312. The storage gate (SG) transistor is controlled by signal SG, as discussed more fully with respect to FIG. 4. The storage gate transistor controls flow of electrons from the photodiode region 318 to region 312.

Photoshield 330 is provided above storage gate 324 and barrier gate 334 to help define an edge of an aperture through which photons 332 can be captured. Photoshield 330 also helps to prevent photons 332 from affecting the stored electrical charge of the pixel after integration. A transfer gate transistor is formed using regions 312 and region 314 by forming the transfer transistor gate 326 in a region that is above and between regions 312 and 314. The transfer gate (TG) transistor is controlled by signal TG, as discussed more fully with respect to FIG. 6. The transfer gate transistor controls flow of electrons from the (storage) region 312 to (floating diffusion) region 314 when the captured charged is being transferred for later measurement. The transfer gate transistor also controls flow of electrons from the floating diffusion region 314 to region 312 when the pixel is being globally reset.

A global reset transistor is formed using region 316 and region 314 by forming the global reset gate 328 in a region that is above and between regions 316 and 314. The global reset (GR) transistor is controlled by signal GR, as discussed more fully with respect to FIG. 4. The global reset transistor controls flow of electrons from the reset voltage (VRST) region 316 to floating diffusion (FD) region 314 when the pixel is being (globally) reset.

FIG. 4 is a timing diagram illustrating operation of a sample globally reset pixel array using pixel embodiments such as those shown in FIGS. 2-3. At time T0, signals GR (global reset), TG (transfer gate), SG (source gate), BG (barrier gate) are asserted. In some embodiments, all row-select lines are simultaneously asserted during a global reset time to reset all pixels at the same time. In some embodiments, the SG transistor and the TG transistor are activated in response to the GR signal.

With reference to FIG. 3, transistor gates 334, 324, 326, and 328 are all simultaneously activated. In response, signal VRST (reset voltage) propagates from node 316 across the N-channel formed under the gate 328 such that region 314 (floating diffusion) is charged to the VRST voltage (less the threshold voltage of gate 328), or to $V_{pin}$ if the photodiode is fully depleted. With gates 326 324, and 334 being activated, region 310 (a photosensitive region of the pixel photodiode) is pre-charged to the VRST voltage (less the threshold voltage of the intervening gates). In the case that the photodiode is a fully depletable pinned photodiode, the photodiode is reset to $V_{pin}$ so long as $V_{pin} < VRST - V_{threshold}$. Accordingly, the pixels within the pixel array can be concurrently reset in accordance with the disclosed global reset.

In FIG. 4, each pixel in the pixel array undergoes an integration period at time T 1. During the integration period, the photosensitive portion (region 310) of the pixel photodiode is exposed to incident light 332, which causes electron-hole pairs (charge) to be created and accumulated. The integration period ends at time T2, where the barrier gate and storage gate are activated. Activation of the barrier gate and sample gate allows the cumulative charge to be transferred from the photodiode to the storage gate. As shown in the figure, the barrier gate is deactivated before the storage gate is deactivated to help prevent backflow of the accumulated charge from the storage gate back to the photodiode. The transfer gate is not activated at this time, which prevents flow of the charge to the floating diffusion region, which substantially maintains its pre-charged level. The charge transferred to the storage gate is stored there while the storage gate is on.

At time T3, a row-select line is asserted that prepares all pixels within the row of a pixel array to be measured. At time T4, the floating diffusion voltage (as buffered by the source-followers) is measured. At time T5, the transfer gate is turned on, allowing charge to be transferred from the storage gate to the floating diffusion. The storage gate is actively turned off to help by forcing charge out of the storage gate. Because the BG is off, the charge in the storage gate is forced to transfer to the floating diffusion. Using FIG. 3 as an example, signal TG of FIG. 3 is activated because the row-select line RS0 is activated. Thus the accumulated charge from integration (the exposure value) is transferred to the floating diffusion. At time T6, the floating diffusion voltage, as buffered by the source-followers, is measured. At the end of time T6, row-select line RS0 is deactivated. Thus, in this manner, charge can be read out in a row-by-row manner.

FIG. 5A illustrates a cross-section of an embodiment of frontside-illuminated (FSI) pixels 500 in a CMOS image sensor, where the FSI pixels 500 use a color filter arrangement such as color filter array 501, which can be a color filter array using any of the MRUs described herein. The front side of FSI pixels 500 is the side of substrate upon which the photosensitive area 504 and associated pixel circuitry are disposed, and over which metal stack 506 for redistributing signals is formed. Metal stack 506 includes metal layers M1 and M2, which are patterned to create an optical passage through which light incident on the FSI pixels 500 can reach photosensitive or photodiode ("PD") regions 504. To implement a color image sensor, the front side includes color filter arrangement 100, with each of its individual color filters (individual filters 503 and 505 are illustrated in this particular cross section) disposed under a microlens 506 that aids in focusing incident light onto PD region 504.

FIG. 5B illustrates a cross-section of an embodiment of backside-illuminated (BSI) pixels 550 in a CMOS image sensor, where the BSI pixels use an embodiment of a color filter array 501, which can be a color filter array using any of the MRUs described herein. As with pixels 500, the front side of pixels 550 is the side of substrate upon which the photosensitive regions 504 and associated pixel circuitry are disposed, and over which metal stack 506 is formed for redistributing signals. The backside is the side of the pixels opposite the front side. To implement a color image sensor, the backside includes color filter array 501, with each of its individual color filters (individual filters 503 and 505 are illustrated in this particular cross section) disposed under a microlens 506. Microlenses 506 aid in focusing incident light onto photosensitive regions 504. Backside illumination of pixels 550 means that the metal interconnect lines in metal stack 506 do not obscure the path between the object being imaged and the photosensitive regions 504, resulting in greater signal generation by photosensitive regions.

Figure 6A:
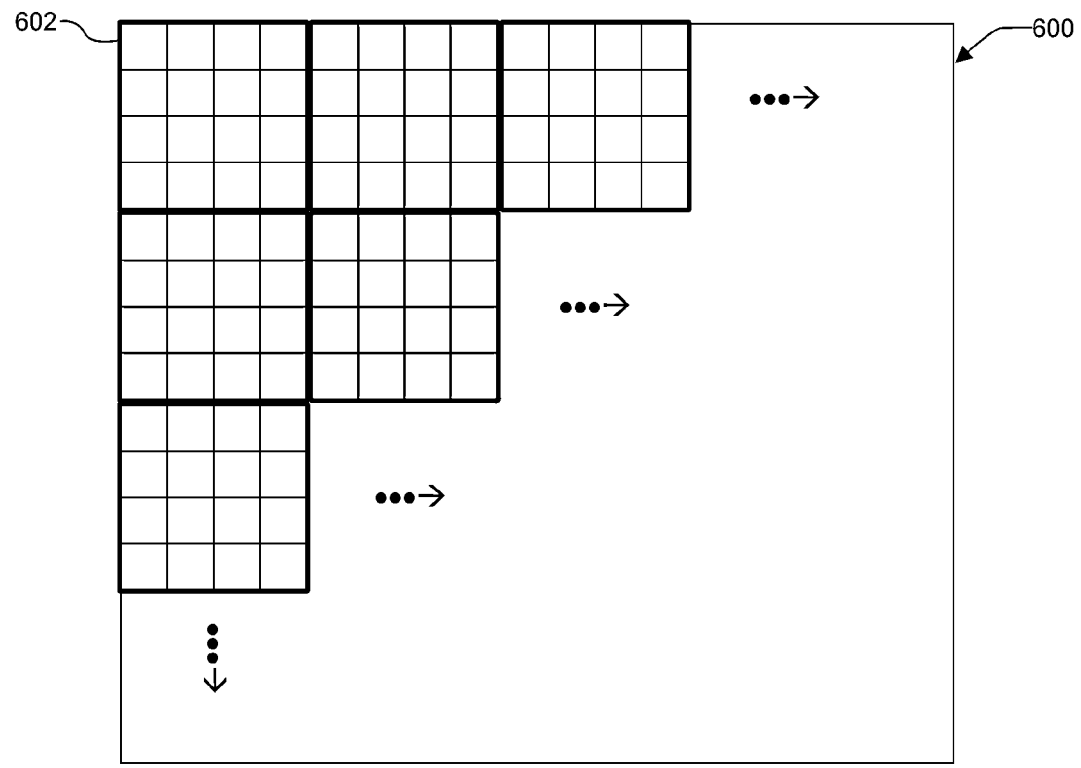
FIGS. 6A-6F are diagrams that explain the terminology used to describe embodiments of color filter arrays, minimal repeating units, or constituent filter patterns.

FIGS. 6A-6F illustrate various concepts and terminology that will be used in the discussion of color filter arrays (CFAs), minimal repeating units (MRUs), and constituent patterns that follows. FIG. 6A illustrates an embodiment of a CFA 600. CFA 600 includes a number of individual filters that substantially corresponds to the number of individual pixels in the pixel array to which the CFA is or will be coupled. Each individual filter has a particular photoresponse and is optically coupled to a corresponding individual pixel in the pixel array. As a result, each pixel has a particular color photoresponse selected from a set of photoresponses. A particular photoresponse has high sensitivity to certain portions of the electromagnetic spectrum while simultaneously having low sensitivity to other portions of the spectrum. Because CFAs assign a separate photoresponse to each pixel by placing a filter over the pixel, it is common to refer to a pixel as a pixel of that particular photoresponse. Hence a pixel can be referred to as a "clear pixel" if it has no filter or is coupled to a clear (i.e., colorless) filter, as a "blue pixel" if it is coupled to a blue filter, as a "green pixel" if it is coupled to a green filter, or as a "red pixel" if it is coupled to a red filter, and so on.

The set of color photoresponses selected for use in a sensor usually has at least three colors but can also include four or more. As used herein, a white or panchromatic photoresponse refers to a photoresponse having a wider spectral sensitivity than those spectral sensitivities represented in the selected set of color photoresponses. A panchromatic photosensitivity can have high sensitivity across the entire visible spectrum. The term panchromatic pixel will refer to a pixel having a panchromatic photoresponse. Although the panchromatic pixels generally have a wider spectral sensitivity than the set of color photoresponses, each panchromatic pixel can have an associated filter. Such filter is either a neutral density filter or a color filter.

In one embodiment the set of photoresponses can be red, green, blue, and clear or panchromatic (i.e., neutral or colorless). In other embodiments, CFA 600 can include other photoresponses in addition to, or instead of, those listed. For instance, other embodiments can include cyan (C), magenta (M), and yellow (Y) filters, clear (i.e., colorless) filters, infrared filters, ultraviolet filters, x-ray filters, etc. Other embodiments can also include a filter array with an MRU that includes a greater or lesser number of pixels than illustrated for MRU 602.

The individual filters in CFA 600 are grouped into minimal repeating units (MRUs) such as MRU 602, and the MRUs are tiled vertically and horizontally, as indicated by the arrows, to form CFA 600. A minimal repeating unit is a repeating unit such that no other repeating unit has fewer individual filters. A given color filter array can include several different repeating units, but a repeating unit is not a minimal repeating unit if there is another repeating unit in the array that includes fewer individual filters.

Figure 6B:
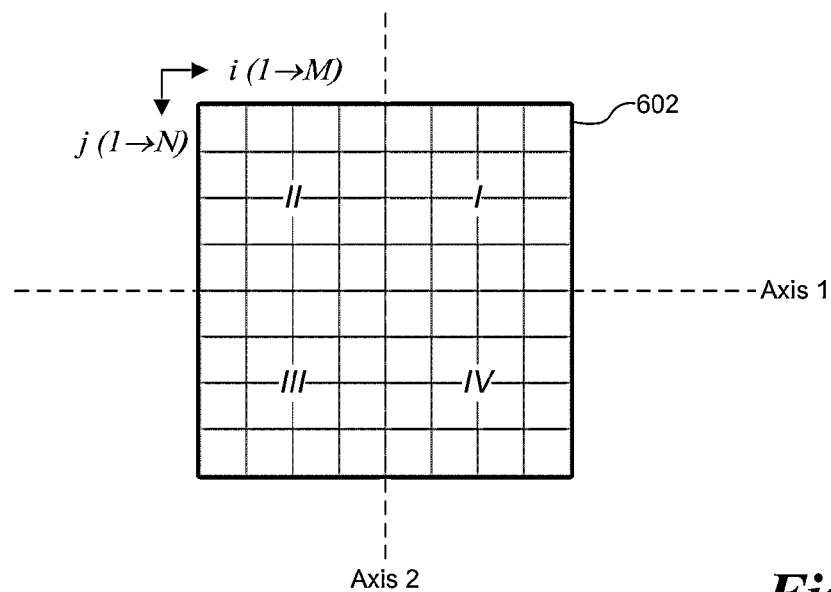

FIG. 6B illustrates an embodiment of an MRU 602. MRU 602 is an array of individual filters grouped into rows and columns. MRU 602 includes M columns and N rows, with columns measured by index and rows measured by index j, so that i ranges from 1 to M and j ranges from 1 to N. In the illustrated embodiment MRU 602 is square, meaning that N=M, but in other embodiments N need not equal M.

MRU 602 can be divided into four quadrants, with first through fourth quadrants numbered I-IV and arranged counterclockwise starting from the top right: quadrant I in the upper right, quadrant II in the upper left, quadrant III in the lower left, and quadrant IV is the lower right. As discussed below, one way of forming an MRU such as MRU 602 is to arrange multiple constituent patterns that are smaller than MRU 602 in different quadrants. MRU 602 also includes a set of axes 1 and 2 that are orthogonal and substantially bisect the MRU: axis 1 divides MRU 602 into top and bottom halves, while axis 2 divides the MRU into left and right halves. In other embodiments other sets of axes are possible, and the axes not need not be orthogonal to each other; for example, in other embodiments the diagonals of the MRU can form the axes of MRU.

Figure 6C:
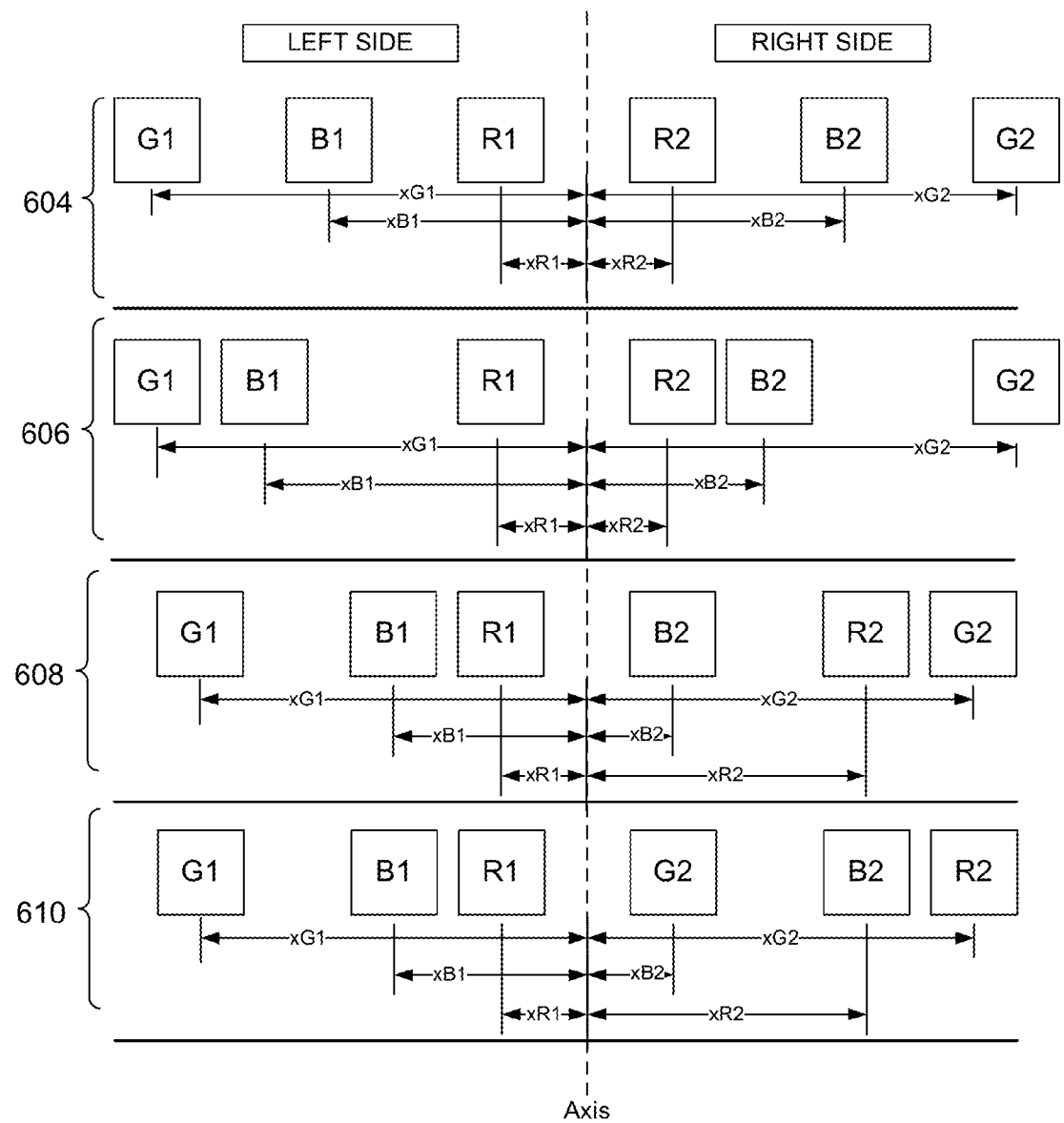

FIG. 6C illustrates the terminology used in this disclosure to describe some aspects of MRUs, in particular their symmetry, asymmetry, or anti-symmetry. The figure shows red (R), green (G), and blue (B) filters position on the left and right sides of an axis. Filters on the left side have subscript 1 (R1, B1, etc.), while filters on the right side have subscript 2 (R2, B2, etc.).

Row 604 is both physically and sequentially symmetric about the axis, such that the left and right sides are mirror images of each other about the axis. Row 604 is physically symmetrical because the positions of each color relative to the axis are the same: R1 and R2 are the same distance from the axis (xR1=xR2), B1 and B2 are at the same distance from the axis (xB1=xB2), and so on. And the row is also sequentially symmetric because the color sequence is symmetric about the axis: moving to the right from the axis, the color sequence is RBG and moving to the left from the axis the color sequence is also RBG.

Row 606 illustrates an embodiment that is not physically symmetric about the axis but is sequentially symmetric. Row 606 is not physically symmetric (i.e., it is physically asymmetric) because the position of each color relative to the axis is not the same: R1 and R2 are different distances from the axis (xR1≠xR2), blue pixels B1 and B2 are at different distances from the axis (xB1≠xB2), and so on. But although the illustrated embodiment is not physically symmetric, it is nonetheless sequentially symmetric because the color sequence is symmetric about the axis: moving to the right from the axis the color sequence is RBG, and similarly moving to the left from the axis the color sequence is also RBG.

Row 608 illustrates an embodiment that is physically and sequentially asymmetric—that is, neither sequentially symmetric nor physically symmetric about the axis. Row 608 is not physically symmetric because the position of each color relative to the axis is not the same: R1 and R2 are different distances from the axis (xR1≠xR2), blue pixels B1 and B2 are at different distances (xB1≠xB2), and so on. Similarly, the row is sequentially asymmetric because the color sequence is not symmetric about the axis: moving to the left from the axis, the color sequence is RBG, but moving to the right from the axis the color sequence is BRG.

Row 610 illustrates an embodiment that is physically asymmetric and sequentially anti-symmetric. Row 608 is not physically symmetric because the position of each color relative to the axis is not the same: R1 and R2 are different distances from the axis (xR1≠xR2), blue pixels B1 and B2 are at different distances (xB1≠xB2), and so on. Similarly, the row is sequentially anti-symmetric because the color sequence on one side of the axis is the exact opposite of the color sequence on the other side of the axis: moving to the left from the axis, the color sequence is RBG, but moving to the right from the axis the color sequence is GBR.

Figures 6D, 6E, 6F:
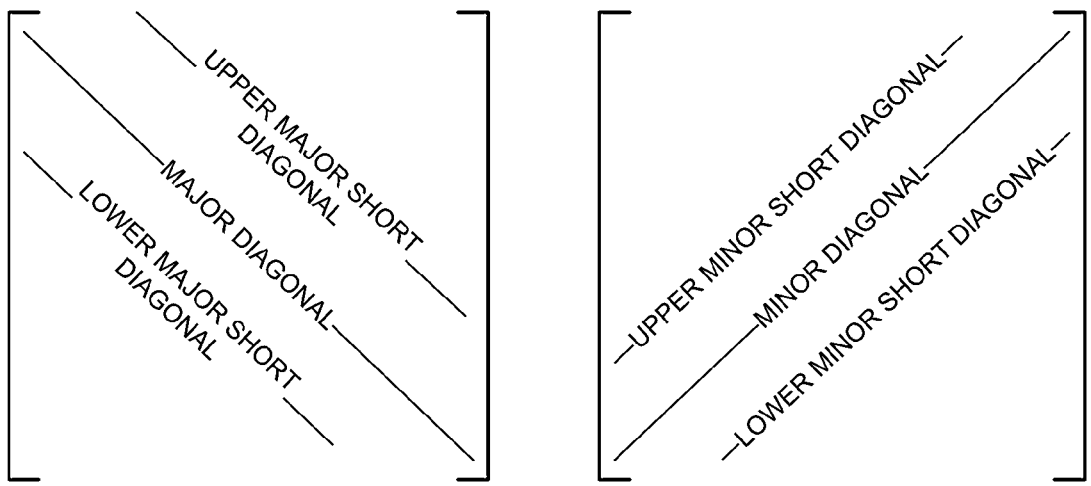

FIG. 6D illustrates terminology that is used below to describe the disclosed 4×4 constituent patterns that can be assembled into an 8×8 MRU, but the terminology can also be used to describe constituent patterns of different dimensions and can be used to describe the MRUs themselves or the color filter array (CFA) as a whole. A major diagonal runs from upper left to lower right, whereas a minor diagonal runs from upper right to lower left. The four pixel long diagonal that runs from top left to bottom right is known as the major long diagonal. Above the major long diagonal, the two pixel diagonal that runs from upper left to lower right is known as the upper major short diagonal. Below the major long diagonal, the two pixel diagonal that runs from upper left to lower right is known as the lower major short diagonal. The terminology used for minor diagonals would be similar, as shown in the figure. This disclosure discusses only major diagonals, but this is only for illustrative purposes. Embodiments involving minor diagonals are alternative embodiments, so although they are not discussed below, they should be considered as part of this disclosure.

FIGS. 6E-6F illustrate embodiments of checkerboard filter patterns. A checkerboard pattern is one in which alternating filters in the array that forms the MRU or the array that forms a constituent pattern have the same photoresponse, for instance filters having a first photoresponse. The first photoresponse used to form the checkerboard can also be called the checkerboard photoresponse. The checkerboard photo response, then, takes up substantially half the individual filters in an MRU In the illustrated embodiment the checkerboard photoresponse is white or panchromatic, but in other embodiments the checkerboard photoresponse can be different, such as green. As explained below the remaining spots in the pattern—those that are not part of the checkerboard—can be filled with filters of second, third, and fourth photoresponses that are different from the first or checkerboard photoresponse.

FIG. 6E illustrates a checkerboard embodiment formed by placing filters having the checkerboard photoresponse on even-numbered columns (i even) of odd-numbered rows (j odd), and placing filters having the checkerboard photoresponse on odd-numbered columns (i odd) of even-numbered rows (j even). FIG. 6F illustrates a checkerboard embodiment formed by placing filters having the checkerboard photoresponse on odd-numbered columns (i odd) of odd-numbered rows (j odd), and placing filters having checkerboard photoresponse on even-numbered columns (i even) of even-numbered rows (j even).

Basic RGBW Constituent Patterns

Figures 7A, 7B, 7C:
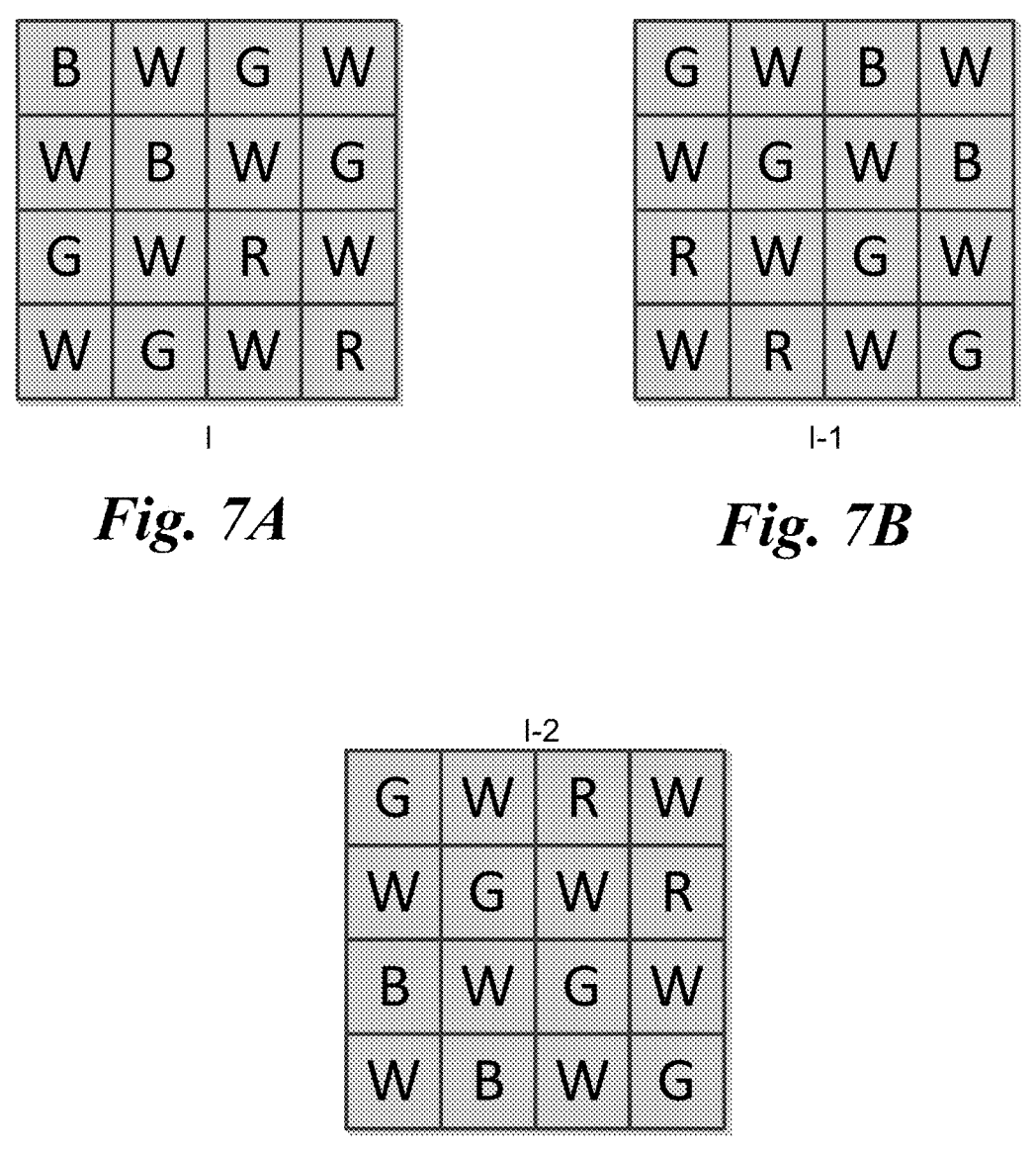

FIGS. 7A-7K illustrate embodiments of constituent patterns that can be assembled to form an MRU by using sets of four constituent patterns arranged into the quadrants shown in FIG. 6B. FIGS. 7A-7C illustrate a first constituent pattern, which will be called constituent pattern I, and some of its variations; FIGS. 7D-7K illustrate a second constituent pattern, which will be called constituent pattern II, and some of its variations. The constituent patterns illustrated in FIGS. 7A-7K are 4×4 patterns that can be assembled in sets of four to form an 8×8 MRU, but in other embodiments the constituent patterns can be of a size different than 4×4. MRU's formed from sets of four of these other constituent pattern embodiments can have a size different than 8×8.

Generally, the constituent patterns illustrated in FIGS. 7A-7K use a set of four photoresponses that include a first photoresponse used for the checkerboard as well as second, third, and fourth photoresponses used for the non-checkerboard filters. In the illustrated embodiment the first or checkerboard photoresponse is panchromatic or white (W) and the second, third, and fourth photoresponses are selected from among red (R), green (G), and blue (B). Other embodiments can, of course, use different sets of photoresponses. For instance, other embodiments can include cyan (C), magenta (M), and yellow (Y) filters, clear (i.e., colorless) filters, infrared filters, ultraviolet filters, x-ray filters, etc.

In the illustrated embodiments, the number of non-checkerboard filters—that is, filters of the second, third, and fourth photoresponses—is made as close to equal as possible. Exact equality can be achieved in embodiments where the number of non-checkerboard filters is evenly divisible by the number of photoresponses to be allocated, but only approximate equality can be achieved in embodiments where the number of non-checkerboard filters is not evenly divisible by the number of photoresponses to be allocated. In other embodiments, filters of each of the second, third, and fourth photo responses can vary between 0% and 100% of the non-checkerboard filters, as well as any individual number or sub range therebetween.

FIGS. 7A-7C illustrate constituent pattern I and some of its variations. FIG. 7A illustrates constituent pattern I, which because of its filter arrangement can suffer from color aliasing in the diagonal direction. If constituent pattern I is used alone to construct a larger MRU, the same diagonal color aliasing problem will persist. Some variations of these constituent patterns can be helpful to reduce color aliasing.

FIG. 7B illustrates constituent pattern I-1, which is a variation of constituent pattern I. Contrasting with constituent pattern I, there are two primary modifications: the green (G) pixels are now moved to the major long diagonal, and the blue (B) pixel couplet BB and the red (R) pixel couplet RR are moved to the major short diagonals. More specifically, the BB couplet now occupies the upper major short diagonal, and the RR couplet now occupies the lower major short diagonal. Alternatives to these modifications can include the reversal of diagonals for the BB and RR couplets, having G pixels occupying only a portion of the major long diagonal, etc.

FIG. 7C illustrates constituent pattern I-2, which is another variation of constituent pattern I. This pattern is similar to constituent pattern I-1, except that couplet BB now occupies the lower major short diagonal and couplet RR now occupies the upper major short diagonal. Alternatives are similar as discussed above.

Figures 7D, 7E, 7F, 7G:
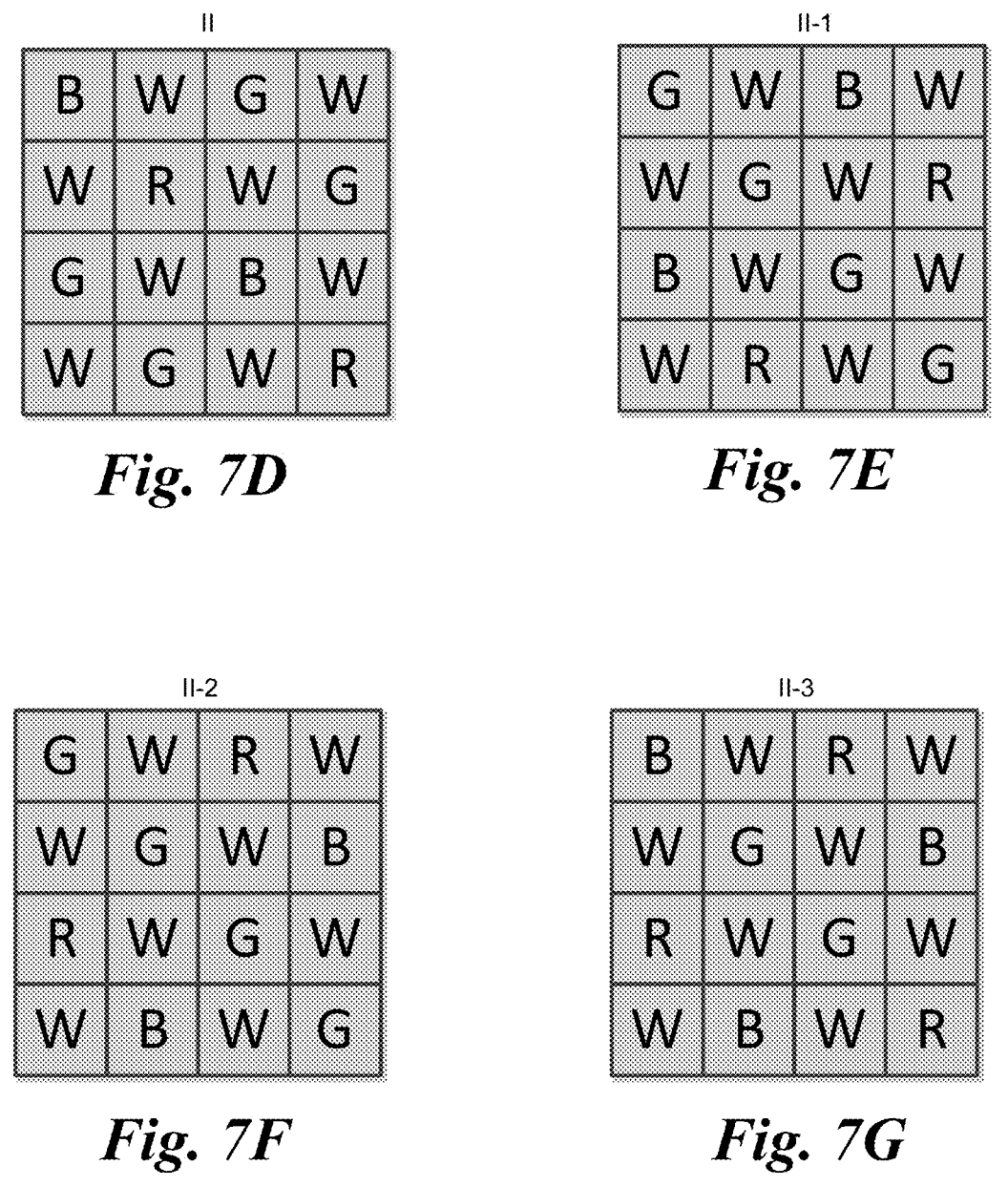

FIGS. 7D-7K illustrate constituent pattern II and some of its variations. FIG. 7D illustrates constituent pattern II which, like constituent pattern I, can suffer from color aliasing in the diagonal direction. If constituent pattern II is used alone to construct a larger MRU, the same diagonal color aliasing problem will persist. Some variations of these constituent patterns can be helpful to reduce color aliasing.

FIG. 7E illustrates constituent pattern II-1, which is a variation of constituent pattern II. Contrasting with constituent pattern II, there are two primary modifications: the G pixels are moved to occupy the entire major long diagonal and the BR (or alternatively RB) couplets are moved to the major short diagonals. Alternatives to these modifications are similar to those discussed in the disclosure relating to the first embodiment.

FIG. 7F illustrates constituent pattern II-2, which is another variation of constituent pattern II. This pattern is similar to constituent pattern II-1, except that couplet RB is used instead of couplet BR. Alternatives are similar as discussed above.

RGBW Constituent Patterns with Semi-Randomization

To improve the reduction of color aliasing, the basic RGBW constituent patterns disclosed above can be further modified according to more complicated rules. As in the RGBW constituent patterns disclosed above, the first photoresponse (W in the illustrated embodiments) still forms a checkerboard pattern, but the filters having the second, third, and fourth photoresponses (R, G, and B in these embodiments) are allocated more randomly, so that the resulting MRU pattern appears more random but still follows certain rules. Hence the modification process disclosed for the embodiments illustrated below is termed semi-randomization. In other embodiments not illustrated, the second, third, and fourth photo responses can be allocated completely randomly. An increase of randomness in the placement of non-checkerboard photoresponse filters—that is, filters with the second, third, and fourth photoresponses—is desirable for reducing color aliasing.

FIG. 7G illustrates constituent pattern II-3, which is a variation of constituent pattern II. The major long diagonal of this constituent pattern is a mix of constituent pattern II and constituent pattern II-1 or II-2. Along the major long diagonal, instead of alternating BR or being all G, the top left is B and the bottom right is R, while the two middle pixels are G. The upper and lower major short diagonals are the same as constituent pattern II-2. Alternatives are similar as discussed above.

Figures 7H, 7I, 7J, 7K:
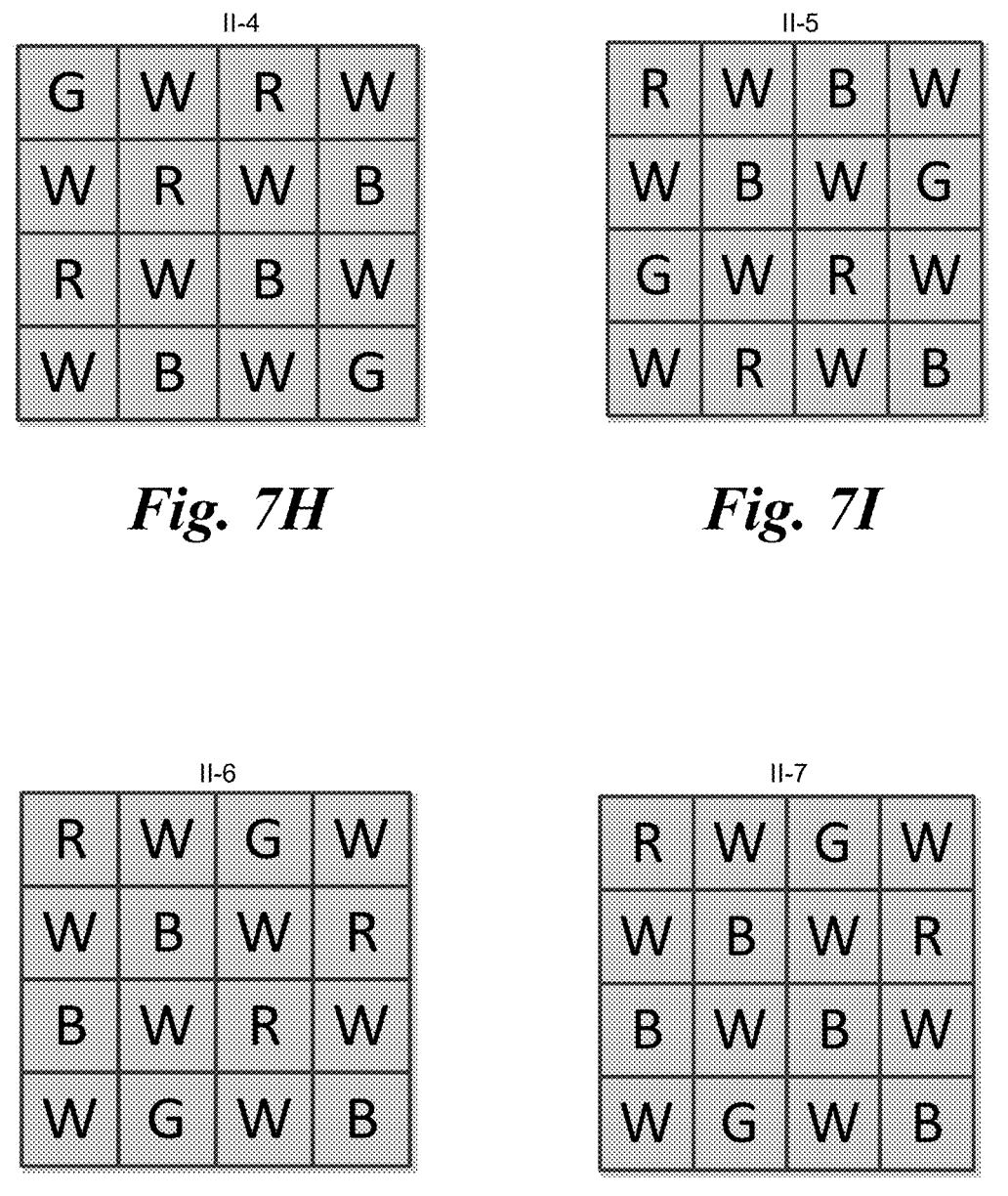

FIG. 7H illustrates constituent pattern II-4, which is another variation of constituent pattern II. This pattern is similar to constituent pattern II-2, except that couplet RB now occupies the two middle pixels of the major long diagonal. Alternatives are similar as discussed above.

FIG. 7I illustrates constituent pattern II-5, which is another variation of constituent pattern II. Several modifications are made here. First, color order along the major long diagonal is reversed from BR to RB. Second, the upper major short diagonal now includes couplet BG instead of couplet GG. Third, the lower major short diagonal now includes couplet GR instead of couplet GG. Alternatives are similar as discussed above.

FIG. 7J illustrates constituent pattern II-6, which is another variation of constituent pattern II. Constituent pattern II-6 is similar to constituent pattern II-5, except that the upper major short diagonal now includes couplet GR instead of couplet GG and the lower major short diagonal now includes couplet BG instead of couplet GG. Alternatives are similar as discussed above.

FIG. 7K illustrates constituent pattern II-7, which is another variation of constituent pattern II. This pattern is similar to constituent pattern II-6, except that an R filter in the major long diagonal is substituted with a B filter, such that the color pattern is now RBBB instead of RBRB. Constituent patterns II-3 through II-7 are only examples of the semi-randomization process. There are more examples that are not shown in the drawings, but are still part of this disclosure.

First RGBW MRU Embodiment and Alternatives

FIG. 8A illustrates an embodiment of a red-green-blue-white (RGBW) MRU using constituent patterns I and I-1. Constituent pattern I-1 occupies the first and third quadrants, and constituent pattern I occupies the second and fourth quadrants. The resulting MRU has non-checkerboard photoresponses (second, third, and fourth photoresponses) that are sequentially symmetric about axis A2 but sequentially asymmetric about axis A1.

There are several alternatives to the present embodiment. First, quadrant assignment to constituent pattern types can be altered. For example, constituent pattern I can occupy the second and fourth quadrant, or the first and second quadrant, and so on, whereas constituent pattern I-1 occupies the remaining quadrants. Second, the number of constituent patterns can also be altered. For example, there can be three constituent patterns I and one constituent pattern I-1, or vice versa. There can also be only one constituent pattern, such as constituent pattern I-1. Various permutations of quadrant assignment and constituent pattern can produce a multitude of alternative embodiments, which are not all illustrated or listed in detail here but are nonetheless part of this disclosure.

Second RGBW MRU Embodiment and Alternatives

FIG. 8B illustrates a second embodiment of an RGBW MRU that uses constituent patterns II and II-1. Constituent pattern II-1 occupies the first and third quadrants, and constituent pattern II occupies the second and fourth quadrants. The resulting MRU has non-checkerboard photoresponses (second, third, and fourth photoresponses) that are sequentially symmetric about both axes A1 and A2. Alternatives to this second embodiment of an MRU are similar to those discussed above in the disclosure relating to the first embodiment.

Third RGBW MRU Embodiment and Alternatives

Figures 8C, 8D:
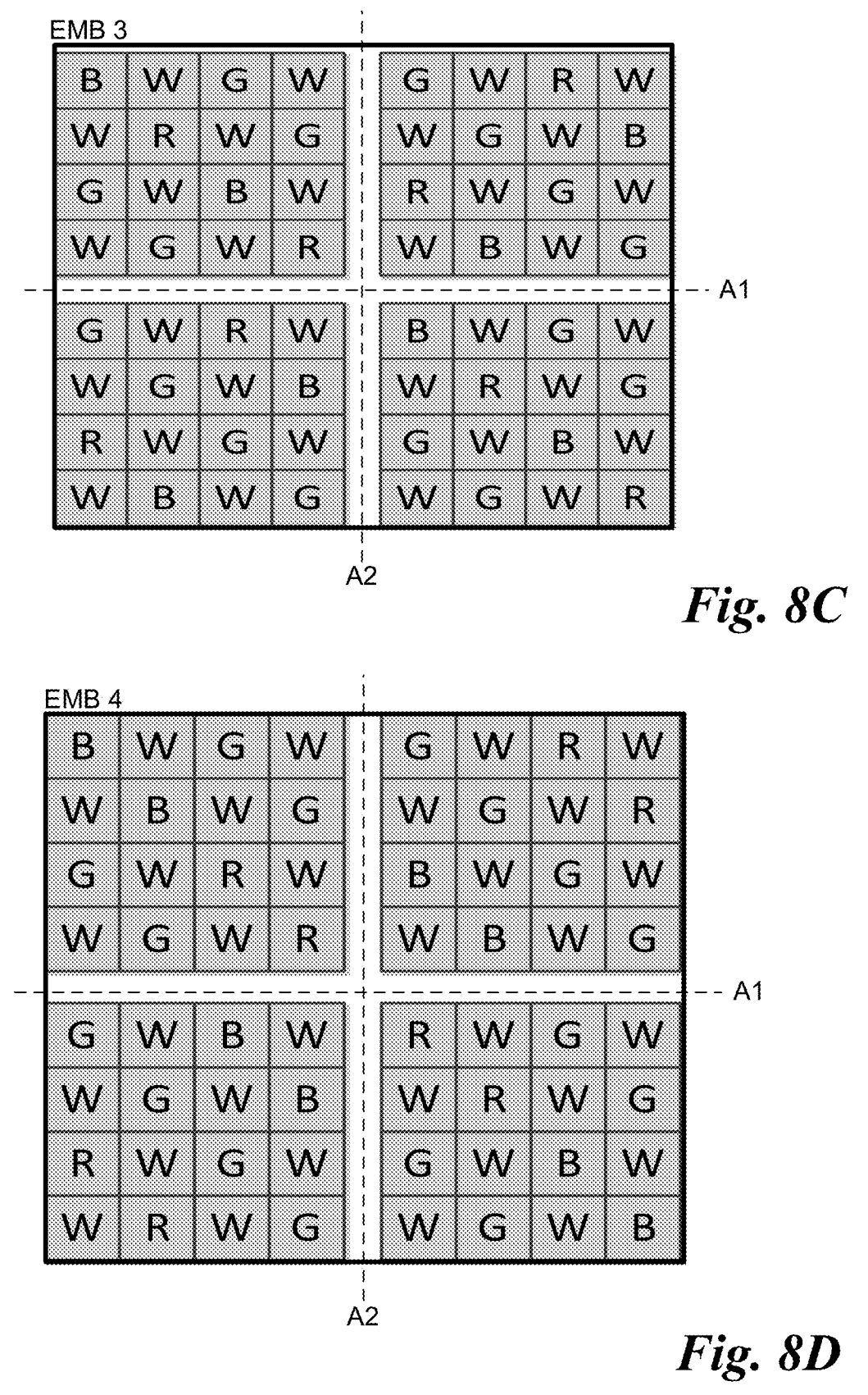

FIG. 8C illustrates a third embodiment of an RGBW MRU using constituent patterns II and II-2. Two constituent patterns II and two constituent patterns II-2 are used to construct the final MRU. Constituent pattern II-2 occupies the first and third quadrants and constituent pattern II occupies the second and fourth quadrants. The resulting MRU has non-checkerboard photoresponses (second, third, and fourth photoresponses) that are sequentially asymmetric about both axes A1 and A2. Alternatives to this third MRU embodiment are similar to those discussed above.

Fourth RGBW MRU Embodiment and Alternatives

FIG. 8D illustrates a fourth embodiment of an RGBW MRU using constituent patterns I and I-2. Two constituent patterns I and two constituent patterns I-2 are used: constituent pattern I-2 occupies the first and third quadrants and constituent pattern I occupies the second and fourth quadrants. The resulting MRU has non-checkerboard photoresponses (second, third, and fourth photoresponses) that are sequentially asymmetric about both axes A1 and A2. Alternatives to this fourth MRU embodiment are similar to those discussed above.

Fifth RGBW MRU Embodiment and Alternatives

Figures 8E, 8F:
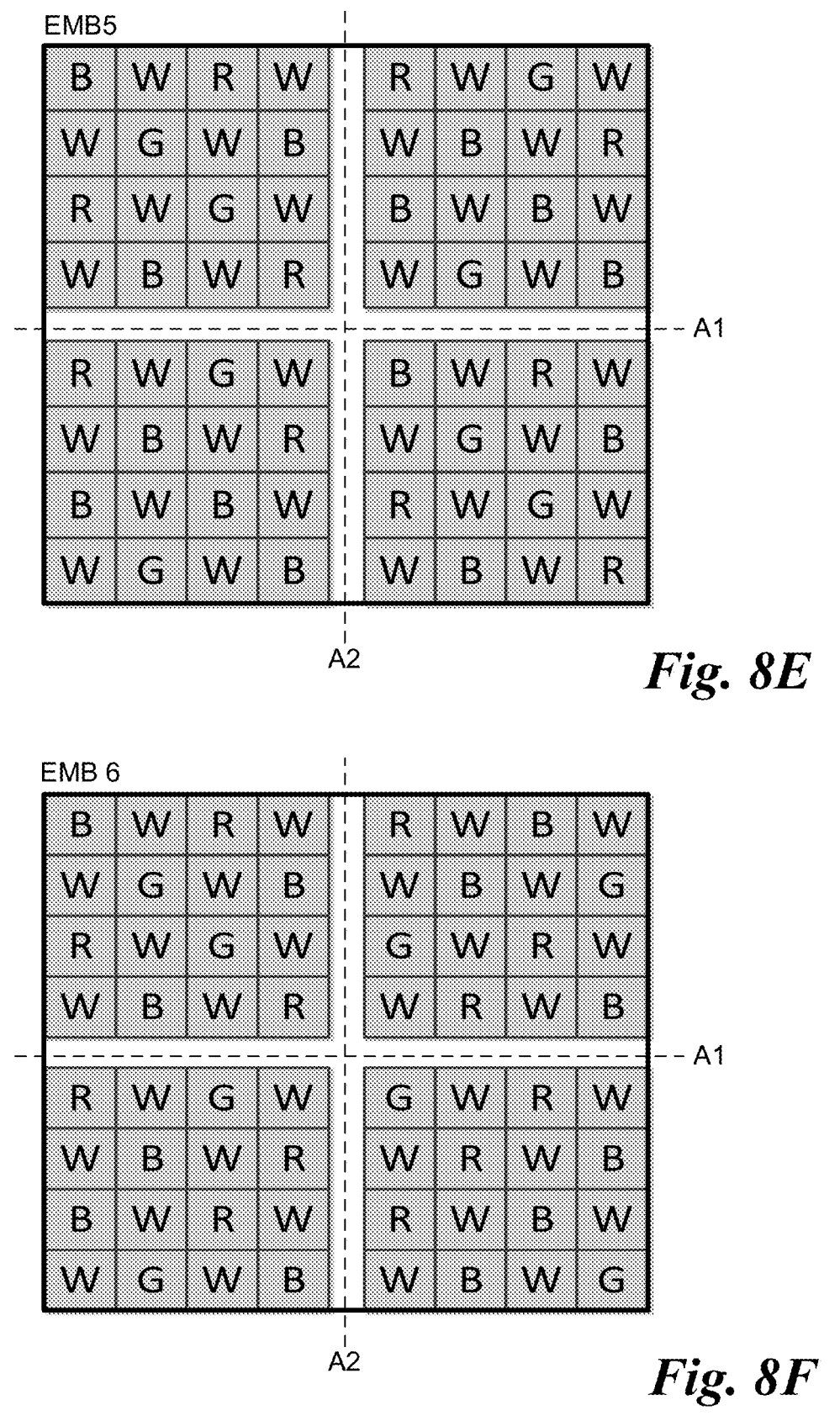

FIG. 8E illustrates a fifth embodiment of an RGBW MRU using constituent patterns resulting from semi-randomization, specifically constituent patterns II-3 and II-7. constituent pattern II-7 occupies the first and third quadrants, and constituent pattern II-3 occupies the second and fourth quadrants. The resulting MRU has non-checkerboard photoresponses (second, third, and fourth photoresponses) that are sequentially asymmetric about both axes A1 and A2. Alternatives to this fifth MRU embodiment are similar to those discussed above.

Sixth RGBW MRU Embodiment and Alternatives

FIG. 8F illustrates a fifth embodiment of an RGBW MRU using constituent patterns resulting from semi-randomization, specifically constituent patterns II-3, II-4, II-5 and II-6. Constituent pattern II-5 occupies the first quadrant, constituent pattern II-3 the second quadrant, constituent pattern II-6 the third quadrant, and constituent pattern II-4 the fourth quadrant. The resulting MRU has non-checkerboard photoresponses (second, third, and fourth photoresponses) that are sequentially symmetric about both axes A1 and A2. Alternatives to this fifth MRU embodiment are similar to those discussed above.

RGB-IR Constituent Patterns

To improve reduction of color aliasing while improving the infrared (IR) response of CCD or CMOS image sensors, the RGBW constituent patterns disclosed in FIGS. 7G-7K can be further modified to include IR filters. The resulting RGB-IR pattern will appear to be random but still follows certain rules. It is noted that a red (R) filter allows both red and infrared light to pass to its respective light sensitive region (e.g., photodiode), a green (G) filter allows both green and infrared light to pass, and a blue (B) filter allows both blue and infrared light to pass. In some embodiments, an infrared (IR) pixel is covered with a combination of RGB filter material that only allows infrared light to pass.

In the described RGB-IR constituent patterns the first (checkerboard) photoresponse is green instead of white and the second, third, and fourth photoresponses are selected from among red, blue, and infrared. Other embodiments can, of course, use different sets of photoresponses. For instance, other embodiments can include cyan (C), magenta (M), and yellow (Y) filters, clear (i.e., colorless) filters, infrared filters, ultraviolet filters, x-ray filters, etc.

FIGS. 9A-9F illustrate embodiments of red-green-blue-infrared (RGB-IR) constituent patterns that can be assembled to form an RGB-IR MRU by using sets of four arranged into the quadrants shown in FIG. 6B. FIG. 9A illustrates constituent pattern I-3, which is a variation of constituent pattern I. Contrasting with constituent pattern I, constituent pattern I-3 has two primary modifications: the green (G) pixels of constituent pattern I have been replaced with infrared (IR) pixels and the white (W) (also referred to as clear, or panchromatic) pixels are replaced with green (G) pixels. An IR-IR couplet occupies both the upper major short diagonal and the lower major short diagonal, while the major long diagonal includes a BB couplet in the upper left corner and an RR couplet in the lower right corner.

Constituent pattern I-3 in FIG. 9A is only one example of a constituent pattern than can be used to construct an 8×8, or larger, MRU. Any of the previously-mentioned constituent patterns can be similarly modified. That is, any of RGBW constituent patterns I, I-1, I-2, II, II-1, II-2, II-3, II-4, II-5, II-6, II-7, and their alternatives, can be modified by first replacing the green (G) pixels with infrared (IR) pixels, and then replacing the white (W) pixels with green (G) pixels. Put differently, RGBW constituent patterns I, I-1, I-2, II, II-1, II-2, II-3, II-4, II-5, II-6, II-7, and their alternatives, can be modified such that the first (checkerboard) photoresponse is green instead of white and the second, third, and fourth photoresponses are selected from among red, blue, and infrared. Following are several example constituent patterns and resultant MRUs that implement such modifications.

FIG. 9B illustrates constituent pattern I-4, which is another variation of constituent pattern I. This pattern is similar to constituent pattern I-3, except that couplet RR now occupies the upper left corner and couplet BB now occupies the lower right corner of the major long diagonal.

FIG. 9C illustrates constituent pattern I-5, which is another variation of constituent pattern I. Constituent pattern I-5 is similar to constituent pattern I-3, except that the IR pixels are moved to the major long diagonal, the RR couplet now occupies the upper major short diagonal, and the BB couplet now occupies the lower major short diagonal.

FIG. 9D illustrates constituent pattern I-6, which is similar to constituent pattern I-5 except that couplet BB occupies the upper major short diagonal and couplet RR occupies the lower major short diagonal.

FIG. 9E illustrates constituent pattern II-8, which is another modification of constituent pattern II. Contrasting with constituent pattern II, there are two primary modifications: the green (G) pixels of constituent pattern II have been replaced with infrared (IR) pixels and the white (W) pixels are replaced with green (G) pixels. More specifically, an IR-IR couplet now occupies both the upper major short diagonal and the lower major short diagonal, while the major long diagonal includes a BR couplet in the upper left corner and an BR couplet in the lower right corner.

FIG. 9F illustrates constituent pattern II-9, which is another variation of constituent pattern II. This pattern is similar to constituent pattern II-8, except that the IR pixels are moved to the major long diagonal, a BR couplet now occupies the upper major short diagonal, and another BR couplet now occupies the lower major short diagonal.

First RGB-IR MRU Embodiment and Alternatives

FIG. 10A illustrates a first embodiment of a red-green-blue-infrared (RGB-IR) MRU using constituent patterns I-3 through I-6, meaning that constituent patterns resulting from semi-randomization are included. Constituent pattern I-5 occupies the first quadrant, constituent pattern I-3 the second quadrant, constituent pattern I-6 the third quadrant, and constituent pattern I-4 the fourth quadrant. The resulting MRU has non-checkerboard photoresponses (second, third, and fourth photoresponses) that are sequentially asymmetric about both axes A1 and A2. Various permutations of quadrant assignment and constituent pattern number can produce a multitude of alternative embodiments, which are not listed in details here, but are still considered part of this disclosure.

As is apparent, the first RGB-IR MRU embodiment shown in FIG. 10A is a modified version of the fourth RGBW embodiment shown in FIG. 8D. That is, the first RGB-IR embodiment can be formed by taking the fourth RGBW MRU embodiment, replacing the green (G) pixels with infrared (IR) pixels, and replacing the white (W) pixels with green (G) pixels.

Second RGB-IR MRU Embodiment and Alternatives

FIG. 10B illustrates a second RGB-IR MRU embodiment using constituent patterns II-8 and II-9, meaning constituent patterns resulting from semi-randomization are included. Constituent pattern II-9 occupies the first and third quadrants, while constituent pattern II-8 occupies the second and fourth quadrants. The resulting MRU has non-checkerboard photoresponses (second, third, and fourth photoresponses) that are sequentially asymmetric about both axes A1 and A2. Various permutations of quadrant assignment and constituent pattern number can produce a multitude of alternative embodiments, which are not listed in details here, but are still considered part of this disclosure.

As is apparent, the second RGB-IR MRU embodiment is a modified version of the second RGBW MRU embodiment shown in FIG. 8B. That is, the second RGB-IR MRU embodiment can be formed by taking the second RGBW MRU embodiment, replacing the green (G) pixels with infrared (IR) pixels, and replacing the white (W) pixels with green (G) pixels. Any of the previously discussed RGBW MRU embodiments can be similarly modified to include IR pixels.

Third RGB-IR MRU Embodiment and Alternatives

FIG. 10C illustrates a third RGB-IR MRU embodiment of an infrared MRU using constituent patterns II-8 and II-9, meaning constituent patterns resulting from semi-randomization are included. Constituent pattern II-9 is positioned in the first and third quadrants, while constituent pattern II-8 is positioned in the second and fourth quadrants. The resulting MRU has non-checkerboard photoresponses (second, third, and fourth photoresponses) that are sequentially symmetric about both axes A1 and A2.

In some embodiments, the constituent patterns and the resultant RGB-IR MRU can be constructed following a first rule of composition that dictates ratios of green (G), blue (B), red (R), and infrared (IR) pixels. In one embodiment, the first rule of composition can dictate that a constituent pattern include approximately 50% Green filters, 12.5% Blue filters, 12.5% Red filters, and 25% Infrared filters. This filter ratio can be beneficial in certain applications, such as in three-dimensional (3D) imaging.

As shown above, each of constituent patterns I-3 through I-6, II-8, and II-9, and each of the resultant first and second RGB-IR MRUs follows this rule. That is, each of the constituent patterns I-3 through I-6, II-8, and II-9 have 50% Green filters, 12.5% Blue filters, 12.5% Red filters, and 25% Infrared filters. Similarly, both the first and second RGB-IR MRUs also include 50% Green pixels, 12.5% Blue pixels, 12.5% Red pixels, and 25% Infrared pixels. But in some embodiments the constituent patterns themselves need not follow the first rule of composition, provided that the resultant RGB-IR MRU does. That is, further randomization of the constituent patterns can be performed as long as the resultant color and IR filter array pattern still complies with the first rule of composition.

Fourth RGB-IR MRU Embodiment and Alternatives

In some embodiments, the constituent patterns and the resultant RGB-IR MRU can be constructed following a second rule of composition that provides for a lower density of infrared (IR) pixels. In one embodiment, the second rule of composition can dictate that a pattern include approximately 50% Green pixels, 18.75% Blue pixels, 18.75% Red pixels, and 12.5% Infrared pixels. A ratio such as that provided for by the second rule of composition can be beneficial in certain applications, such as in night vision imaging.

FIGS. 11A-11B illustrate embodiments of a low-density IR constituent pattern and a corresponding embodiment of an MRU. FIG. 11A illustrates a low-density IR constituent pattern. FIG. 11B illustrates a fourth embodiment of an RGB-IR MRU that uses the low-density IR constituent pattern of FIG. 11A positioned in all four quadrants. The resulting MRU has non-checkerboard photoresponses (second, third, and fourth photoresponses) that are sequentially anti-symmetric about both axes Aland A2.

The above description of illustrated embodiments of the invention, including what is described in the abstract, is not intended to be exhaustive or to limit the invention to the precise forms disclosed. While specific embodiments of, and examples for, the invention are described herein for illustrative purposes, various equivalent modifications are possible within the scope of the invention, as those skilled in the relevant art will recognize. These modifications can be made to the invention in light of the above detailed description.

The terms used in the following claims should not be construed to limit the invention to the specific embodiments disclosed in the specification and the claims. Rather, the scope of the invention is to be determined entirely by the following claims, which are to be construed in accordance with established doctrines of claim interpretation.

The invention claimed is:

1. A color filter array comprising:
a plurality of tiled minimal repeating units, each minimal repeating unit comprising an M×N set of individual filters, and each individual filter in the set having a photoresponse selected from among four different photoresponses, wherein each minimal repeating unit includes:
a checkerboard pattern of filters of the first photoresponse, wherein a checkerboard pattern is one in which alternating filters in the set have the same photoresponse, and
filters of the second, third, and fourth photoresponses distributed among the checkerboard pattern such that the filters of the second, third, and fourth photoresponses are sequentially symmetric about one or both of a pair of orthogonal axes of the minimal repeating unit, wherein sequentially symmetric means that the sequence of photoresponse types is in the same order when moving away from either side of one or both of the pair of orthogonal axes.

2. The color filter array of claim 1 wherein the number of filters of any two of the second, third, and fourth photoresponses are substantially equal.

3. The color filter array of claim 1 wherein the first photoresponse is panchromatic (W), the second photoresponse is red (R), the third photoresponse is green (G), and the fourth photoresponse is blue (B).

4. The color filter array of claim 3 wherein M=N=8 and the minimal repeating unit is:

| B | W | G | W | G | W | B | W |
| W | B | W | G | W | G | W | B |
| G | W | R | W | R | W | G | W |
| W | G | W | R | W | R | W | G |
| G | W | B | W | B | W | G | W |
| W | G | W | B | W | B | W | G |
| R | W | G | W | G | W | R | W |
| W | R | W | G | W | G | W | R. |

5. The color filter array of claim 3 wherein M=N=8 and the minimal repeating unit is:

| B | W | G | W | G | W | B | W |
| W | R | W | G | W | G | W | R |
| G | W | B | W | B | W | G | W |
| W | G | W | R | W | R | W | G |
| G | W | B | W | B | W | G | W |
| W | G | W | R | W | R | W | G |
| B | W | G | W | G | W | B | W |
| W | R | W | G | W | G | W | R. |

6. The color filter array of claim 3 wherein M=N=8 and the minimal repeating unit is:

| B | W | R | W | R | W | B | W |
| W | G | W | B | W | B | W | G |
| R | W | G | W | G | W | R | W |
| W | B | W | R | W | R | W | B |
| R | W | G | W | G | W | R | W |
| W | B | W | R | W | R | W | B |
| B | W | R | W | R | W | B | W |
| W | G | W | B | W | B | W | G. |

7. The color filter array of claim 1 wherein the first photoresponse is green (G), the second photoresponse is infrared (IR), the third photoresponse is red (R), and the fourth photoresponse is blue (B).

8. The color filter array of claim 7 wherein the minimal repeating unit includes:
approximately 50% green (G) pixels;
approximately 12.5% blue (B) pixels;
approximately 12.5% red (R) pixels; and
approximately 25% infrared (IR) pixels.

9. The color filter array of claim 7 wherein M=N=8 and the minimal repeating unit is:

| B  | G  | IR | G  | IR | G  | B  | G  |
| G  | R  | G  | IR | G  | IR | G  | R  |
| IR | G  | B  | G  | B  | G  | IR | G  |
| G  | IR | G  | R  | G  | R  | G  | IR |
| IR | G  | B  | G  | B  | G  | IR | G  |
| G  | IR | G  | R  | G  | R  | G  | IR |
| B  | G  | IR | G  | IR | G  | B  | G  |
| G  | R  | G  | IR | G  | IR | G  | R. |

10. An image sensor comprising:
a pixel array including a plurality of individual pixels;
a color filter array positioned over and optically coupled to the pixel array, the color filter array comprising a plurality of tiled minimal repeating units, each minimal repeating unit comprising an M×N set of individual filters, and each individual filter in the set having a photoresponse selected from among four different photoresponses, wherein each minimal repeating unit includes:
a checkerboard pattern of filters of the first photoresponse, wherein a checkerboard pattern is one in which alternating filters in the set have the same photoresponse, and filters of the second, third, and fourth photoresponses distributed among the checkerboard pattern such that the filters of the second, third, and fourth photoresponses are sequentially symmetric about one or both of a pair of orthogonal axes of the minimal repeating unit, wherein sequentially symmetric means that the sequence of photoresponse types is in the same order when moving away from either side of one or both of the pair of orthogonal axes; and circuitry and logic coupled to the pixel array to read out signals from the individual pixels in the pixel array.

11. The image sensor of claim 10 wherein the circuitry and logic include a global shutter that can perform a global reset on the pixel array.

12. The image sensor of claim 10 wherein the number of filters of any two of the second, third, and fourth photoresponses are substantially equal.

13. The image sensor of claim 10 wherein the first photoresponse is panchromatic (W), the second photoresponse is red (R), the third photoresponse is green (G), and the fourth photoresponse is blue (B).

14. The image sensor of claim 13 wherein M=N=8 and the minimal repeating unit is:

| B | W | G | W | G | W | R | W |
|---|---|---|---|---|---|---|---|
| W | B | W | G | W | G | W | B |
| G | W | R | W | R | W | G | W |
| W | G | W | R | W | R | W | G |
| G | W | B | W | B | W | G | W |
| W | G | W | B | W | B | W | G |
| R | W | G | W | G | W | R | W |
| W | R | W | G | W | G | W | R. |

15. The image sensor of claim 13 wherein M=N=8 and the minimal repeating unit is:

| B | W | G | W | G | W | B | W |
|---|---|---|---|---|---|---|---|
| W | R | W | G | W | G | W | R |
| G | W | B | W | B | W | G | W |
| W | G | W | R | W | R | W | G |
| G | W | B | W | B | W | G | W |
| W | G | W | R | W | R | W | G |
| B | W | G | W | G | W | B | W |
| W | R | W | G | W | G | W | R. |

16. The image sensor of claim 13 wherein M=N=8 and the minimal repeating unit is:

| B | W | R | W | R | W | B | W |
|---|---|---|---|---|---|---|---|
| W | G | W | B | W | B | W | G |
| R | W | G | W | G | W | R | W |
| W | B | W | R | W | R | W | B |
| R | W | G | W | G | W | R | W |
| W | B | W | R | W | R | W | B |
| B | W | R | W | R | W | B | W |
| W | G | W | B | W | B | W | G. |

17. The image sensor of claim 10 wherein the first photoresponse is green (G), the second photoresponse is infrared (IR), the third photoresponse is green (G), and the fourth photoresponse is blue (B).

18. The image sensor of claim 17 wherein the minimal repeating unit includes:
- approximately 50% green (G) pixels;
- approximately 12.5% blue (B) pixels;
- approximately 12.5% red (R) pixels; and
- approximately 25% infrared (IR) pixels.

19. The image sensor of claim 17 wherein M=N=8 and the minimal repeating unit is:

| B | G | IR | G | IR | G | B | G |
|---|---|---|---|---|---|---|---|
| G | R | G | IR | G | IR | G | R |
| IR | G | B | G | B | G | IR | G |
| G | IR | G | R | G | R | G | IR |
| IR | G | B | G | B | G | IR | G |
| G | IR | G | R | G | R | G | IR |
| B | G | IR | G | IR | G | B | G |
| G | R | G | IR | G | IR | G | R. |

* * * * *